United States Patent [19]
Hayashi et al.

[11] Patent Number: 5,812,011
[45] Date of Patent: Sep. 22, 1998

[54] CURRENT SWITCHING CIRCUIT FORMED IN AN INTEGRATED SEMICONDUCTOR CIRCUIT

[75] Inventors: Yutaka Hayashi; Takehiko Umeyama, both of Tokyo, Japan

[73] Assignee: Mitsubishi Denki Kabushiki Kaisha, Tokyo, Japan

[21] Appl. No.: 795,663

[22] Filed: Feb. 6, 1997

[30] Foreign Application Priority Data

Oct. 9, 1996  [JP]  Japan .................................. 8-239340

[51] Int. Cl.⁶ .................................................. H03K 17/68
[52] U.S. Cl. ........................ 327/432; 327/431; 327/434; 327/437; 327/542; 327/543
[58] Field of Search ........................... 327/538, 540–543, 327/427, 430–437, 53, 66

[56] References Cited

U.S. PATENT DOCUMENTS

| | | | |
|---|---|---|---|
| 3,708,699 | 1/1973 | Frei et al. | 307/304 |
| 4,177,392 | 12/1979 | Harferl | 307/254 |
| 4,684,880 | 8/1987 | Chan | 323/316 |
| 5,038,053 | 8/1991 | Djenguerian et al. | 307/310 |
| 5,173,625 | 12/1992 | Ueda et al. | 307/475 |
| 5,296,765 | 3/1994 | Williams et al. | 307/572 |
| 5,374,857 | 12/1994 | Carobolante | 327/110 |
| 5,381,083 | 1/1995 | Inamori et al. | 323/313 |
| 5,557,194 | 9/1996 | Kato | 323/315 |

FOREIGN PATENT DOCUMENTS

| | | |
|---|---|---|
| 59-165507 | 9/1984 | Japan . |
| 59-228420 | 12/1984 | Japan . |
| 364211 | 3/1991 | Japan . |

Primary Examiner—Timothy P. Callahan
Assistant Examiner—An T. Luu
Attorney, Agent, or Firm—Leydig, Voit & Mayer

[57] ABSTRACT

A current switching circuit in an integrated semiconductor circuit includes a load connected to a positive power supply; a first pnp bipolar transistor having a collector electrode connected to the load, and a base electrode connected to a DC bias source and an emitter electrode; and a first n channel MOS transistor having a drain electrode connected to the emitter electrode of the first npn bipolar transistor, a source electrode connected to the ground, and a gate electrode connected to an input terminal, the first MOS transistor turning on and off in response to a voltage applied to the input terminal.

10 Claims, 14 Drawing Sheets

CURRENT SWITCHING CIRCUIT FORMED IN AN INTEGRATED SEMICONDUCTOR CIRCUIT

BACKGROUND OF THE INVENTION

1. Field of Invention

The present invention relates to a current switching circuit. More specifically, the invention relates to a current switching circuit which is placed in an integrated semiconductor circuit for driving a laser diode (LD) unit such as a laser printer and a head current of hard disk drive (HDD).

2. Description of the Prior Art

FIG. 15 shows a current switching circuit of the prior art used for an LD driving circuit. In FIG. 15, the prior current switching circuit comprises a power source 1, a data input terminal 3, a laser diode 4, a constant current supply 25, a resistor R, a constant voltage supply V, bipolar transistors Q8, Q81 and Q82. Transistors Q81 and Q82 are differentially connected, and switch the currents $I_1$ or $I_2$ according to the signal level at the data input terminal 3. A transistor Q8 constitutes a constant current supply. In FIG. 15, an input signal is inputted into a base electrode of the transistor Q81. A power supply voltage is applied to a collector electrode of the transistor Q81 from a power supply 1 via the laser diode 4. The laser diode 4 becomes a load resistance of the transistor Q8, and is required to operate at high speed. The base of the transistor Q82 is connected to power supply 5, and the power supply 5 provides threshold voltage (Vt) as an input signal. Emitter electrodes of both transistors Q81 and Q82 are commonly connected to the collector electrode of the transistor Q8. A constant voltage supply is applied to base electrodes of the transistor Q8, and their emitter electrodes are grounded via resistance R.

In the conventional current switching circuit, when the data signal inputted into the data input terminal 3 is logic "H", the transistor Q81 turns on, and the transistor Q82 turns off, and when the data signal inputted into the data input terminal 3 is logic "L", the transistor Q81 turns off, and the transistor Q82 turns on. In this manner, when the data signal is logic "H", the current $I_1$ flows through the laser diode 4 and drives the laser diode 4.

However, in a current switching circuit such as shown in FIG. 15, even when the transistor Q81 is off and current is not provided to the laser diode 4, a constant current flows through the transistor Q82 and consumes power.

Further, since the bipolar transistor Q8 is used as a constant current supply, the voltage $V_{BE}$ between the base and emitter of the transistor Q8 is normally about 0.7 volts, which causes a problem that the dynamic range of the transistor Q81 is limited by the voltage $V_{BE}$ of the transistor Q8. Moreover, when the power supply is about 3 to 5 volts, this 0.7 volts greatly influences the dynamic range.

It is an object of the present invention to provide a current switching circuit with less power consumption, less distortions of the current wave, and wider dynamic range.

SUMMARY OF THE INVENTION

According to one aspect of the invention, a first type current switching circuit comprises a load whose one end is connected to a positive power supply; a first npn type bipolar transistor whose collector electrode is connected to the other end of the load, a base electrode is connected to an output of a DC bias source; and a first n channel MOS transistor whose drain electrode is connected to an emitter electrode of the first npn type bipolar transistor and whose source electrode is connected to the ground and whose gate electrode is connected to an input terminal; wherein the first MOS transistor turns on and off in response to a voltage applied to the input terminal.

According to another aspect of the invention, the DC bias source in a first type current switching circuit comprises a constant current supply whose one end is connected to the positive power supply; a second bipolar transistor whose collector electrode is connected to the other end of the constant current supply, whose base electrode is connected to a base electrode of the first npn type bipolar transistor to form a current mirror; and a second MOS transistor whose drain electrode is connected to an emitter electrode of the second npn type bipolar transistor, and whose gate electrode is connected to a positive power supply; wherein the first n channel MOS transistor turns on and off in response to a voltage applied to the input terminal.

According to further aspect of the invention, the DC bias source in a first type current switching circuit further comprises a third npn type bipolar transistor whose collector electrode is connected to the positive power supply, whose emitter electrode is connected to the base electrode of the first npn type bipolar transistor, and whose the gate electrode is connected to the other end of the constant current supply.

According to further aspect of the invention, the DC bias source in a first type current switching circuit further comprises a third npn type bipolar transistor whose collector electrode and base electrode are connected to a base electrodes of the first and second npn type bipolar transistors; and a third n channel MOS transistor whose drain electrode is connected to an emitter electrode of the third npn type bipolar transistor, whose source electrode is connected to the ground, and whose gate electrode is connected to the input terminal via an inverter.

According to further aspect of the invention, the DC bias source in a first type current switching circuit further comprises a fourth bipolar transistor whose collector electrode is connected to the positive power supply, whose emitter electrode is connected to the base electrodes of the first and second npn type bipolar transistors, and whose base electrode is connected to the other end of the constant current supply; a third npn type bipolar transistor whose collector electrode and base electrode are connected to base electrodes of the first and second npn type bipolar transistors; and a third n type MOS transistor whose source electrode is connected to an emitter electrode of the third npn type bipolar transistor, whose source electrode is connected to the ground, and whose gate electrode is connected to the input terminal via an inverter.

A first type current switching circuit comprises a first inductance load and a second inductance load whose respective one end are commonly connected to a positive power supply; a first npn type bipolar transistor whose collector electrode is connected to the other end of the first inductance load, and whose base electrode is connected to an output of a DC bias source; a first n channel MOS transistor whose drain electrode is connected to an emitter electrode of the first bipolar transistor, whose source electrode is connected to the ground, and whose gate electrode is connected to an input terminal; a second npn type bipolar transistor whose collector electrode is connected to the other end of the second inductance load, and whose base electrode is connected to the output of the DC bias source; a second n channel MOS transistor whose drain electrode is connected to an emitter electrode of the second bipolar transistor, whose source electrode is connected to the ground, and whose gate electrode is connected to an input terminal via an inverter; and further the DC bias source comprises:

a constant current supply whose one end is connected to the positive power supply; a third npn type bipolar transistor whose collector electrode is connected to the other end of the constant current supply, and whose base electrode is connected to the base electrodes of the first and second npn type bipolar transistor to form a current mirror; a fifth bipolar transistor whose collector electrode is connected to the positive power supply, whose emitter electrode is connected to the base electrodes of the first, second and third npn type bipolar transistors, and whose base electrode is connected to the other end of the constant current supply; a third n type MOS transistor whose drain electrode is connected to an emitter electrode of the second npn type bipolar transistor, whose source electrode is connected to the ground, and whose gate electrode is connected to a second positive power supply; a fourth npn type bipolar transistor whose collector electrode and base electrode are connected to base electrodes of the first, second and third npn type bipolar transistors; and a fourth n type MOS transistor whose drain electrode is connected to an emitter electrode of the third npn type bipolar transistor, whose source electrode is connected to the ground, and whose gate electrode is connected to the second positive power supply; wherein the first MOS transistor and the second n channel MOS transistor reversely turns on and off in response to the voltage applied to the input terminal.

According to still further aspect of the invention, a second type current switching circuit comprises a load whose one end is connected to a ground; a first pnp type bipolar transistor whose collector electrode is connected to the other end of the load, whose base electrode is connected to a DC bias source; and a first p channel MOS transistor whose drain electrode is connected to an emitter electrode of the pnp type bipolar transistor and the whose source electrode is connected to the positive power supply and whose gate electrode is connected to an input terminal; wherein the first MOS transistor turns on and off in response to a voltage applied to the input terminal.

According to further aspect of the invention, the DC bias source in a second type current switching circuit comprises a constant current supply whose one end is connected the ground; a second bipolar transistor whose collector electrode is connected to the other end of the constant current supply, whose base electrode is connected to the base electrode of the first pnp type bipolar transistor to form a current mirror; a second MOS transistor whose drain electrode is connected to an emitter electrode of the second pnp type bipolar transistor, and whose gate electrode is connected to a ground; wherein the first p channel MOS transistor turns on and off in response to the voltage applied to the input terminal.

According to further aspect of the invention, the DC bias source in a second type current switching circuit further comprises a third pnp type bipolar transistor whose collector electrode is connected to the ground, whose emitter electrode is connected to the base electrodes of the first and second pnp type bipolar transistors, and whose base electrode is connected to the other end of the constant current supply.

According to further aspect of the invention, the DC bias source in a second type current switching circuit further comprises a third pnp type bipolar transistor whose collector electrode and base electrode are connected to the base electrodes of the first and second pnp type bipolar transistors; and a third p channel MOS transistor whose drain electrode is connected to an emitter electrode of the third pnp type bipolar transistor, whose source electrode is connected to the positive power supply, and whose gate electrode is connected to the input terminal via an inverter.

According to further aspect of the invention, the DC bias source in a second type current switching circuit further comprises a fourth pnp type bipolar transistor whose collector electrode is connected to the ground, whose emitter electrode is connected to the base electrodes of the first and second pnp type bipolar transistors, and whose base electrode is connected to the other end of the constant current supply; a third pnp type bipolar transistor whose collector electrode and base electrode are connected to base electrodes of the first and second pnp type bipolar transistors; and a third p channel MOS transistor whose drain electrode is connected to an emitter electrode of the third pnp type bipolar transistor, whose source electrode is connected to the positive power supply, and whose gate electrode is connected to the input terminal via an inverter.

According to further aspect of the invention, a second type current switching circuit comprises a first inductance load and a second inductance load whose respective one end are commonly connected to a ground; a first pnp bipolar transistor whose collector electrode is connected to the other end of the first inductance load, and whose base electrode is connected to an output of a DC bias source; a first p channel MOS transistor whose drain electrode is connected to an emitter electrode of the first bipolar transistor, whose gate electrode is connected to an input terminal; a second pnp type bipolar transistor whose collector electrode is connected to the other end of the second inductance load, and whose base electrode is connected to the output of the DC bias source; a second p channel MOS transistor whose drain electrode is connected to an emitter electrode of the second pnp type bipolar transistor, whose gate electrode is connected to an input terminal via an inverter; and further the DC bias source comprises:

a constant current supply whose one end is connected to the ground; a third pnp type bipolar transistor whose collector electrode is connected to the other end of the constant current supply, and whose base electrode is connected to the base electrodes of the first and second pnp type bipolar transistor to form a current mirror; a fifth pnp type bipolar transistor whose collector electrode is connected to the ground, whose emitter electrode is connected to the base electrodes of the first, second and third pnp type bipolar transistors, and whose base electrode is connected to the other end of the constant current supply; a third p type MOS transistor whose drain electrode is connected to an emitter electrode of the second pnp type bipolar transistor, whose source electrode is connected to the positive power supply, and whose gate electrode is connected to the ground; a fourth pnp type bipolar transistor whose collector electrode and base electrode are connected to base electrodes of the first, second and third pnp type bipolar transistors; and a fourth p channel MOS transistor whose drain electrode is connected to an emitter electrode of the third pnp type bipolar transistor, whose source electrode is connected to the positive power supply, and whose gate electrode is connected to the ground; wherein the first MOS transistor and the second n channel MOS transistor reversely turns on and off in response to the voltage applied to the input terminal.

DETAILED DESCRIPTION OF THE PREFERRED EMBODIMENTS

Embodiment 1

Figure 1:
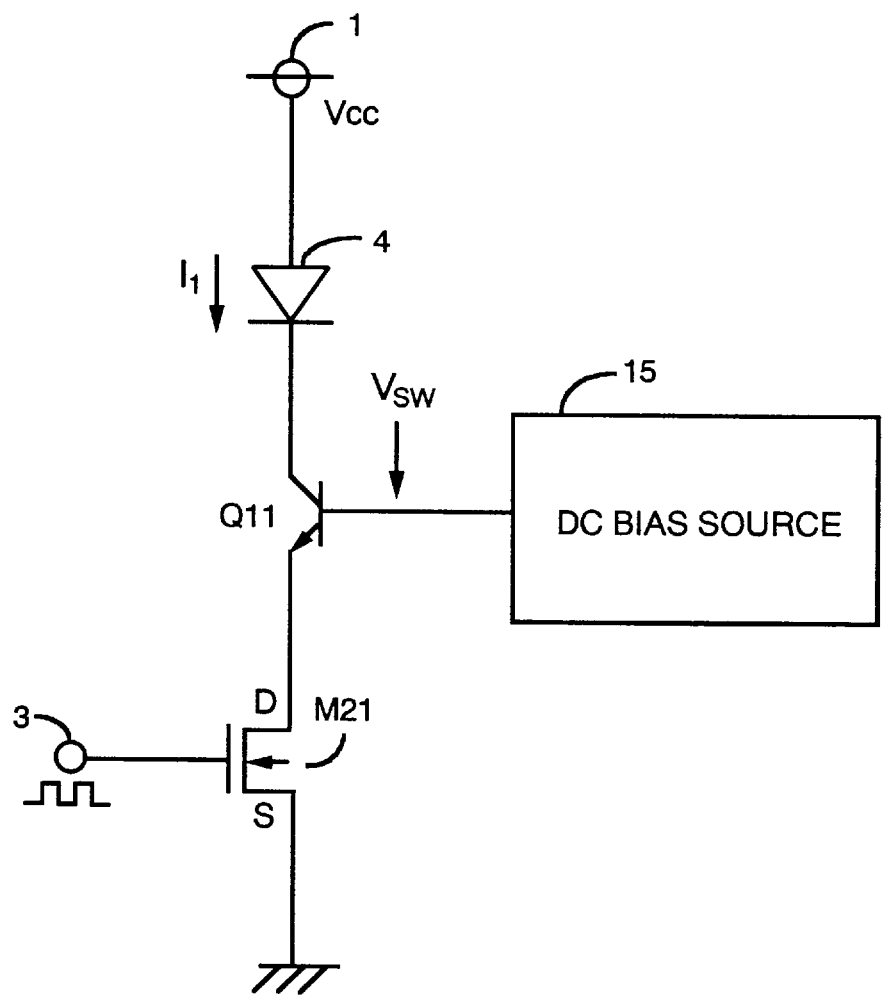
FIG. 1 shows the current switching circuit according to a first embodiment of the present invention.

FIG. 1 shows a current switching circuit according to a first embodiment. In FIG. 1, the current switching circuit comprises a power source 1, a bipolar transistor Q11, an n channel MOS transistor M21 for switching, a data input terminal 3 supplied with a data signal which controls the gate of the switching MOS transistor M21, a laser diode 4 which is driven by the current flowing through in the bipolar transistor Q11 and used such as in a printer, and a DC bias source 15 which controls the base current of the bipolar transistor Q11.

In FIG. 1, an MOS transistor M21 used as a switching circuit and a bipolar transistor Q11 are formed on the same IC. In the prior art of this kind of high frequency switching circuit, a current switching circuit having bipolar transistors and MOS transistors which are formed on the same IC substrate has not yet been disclosed.

By using an MOS transistor as a switching element, it is possible to remove the problematic voltage between the base and the emitter in the conventional bipolar transistor current switching circuit, which makes it possible to widen the dynamic range of the bipolar transistor Q11. In order to increase the switching speed, the bipolar transistor Q11 operates in a base grounded mode. A constant voltage DC bias source 15 supplies the driving current to the base electrode of the bipolar transistor Q11. The current flowing into the bipolar transistor Q11 is controlled by turning on and off the switching MOS transistor M21. When the laser diode 4 is not supplied with a current, a current flowing into the bipolar transistor Q11 can be completely cut off. Therefore, it is possible to reduce the unwanted power consumption.

Figure 2:
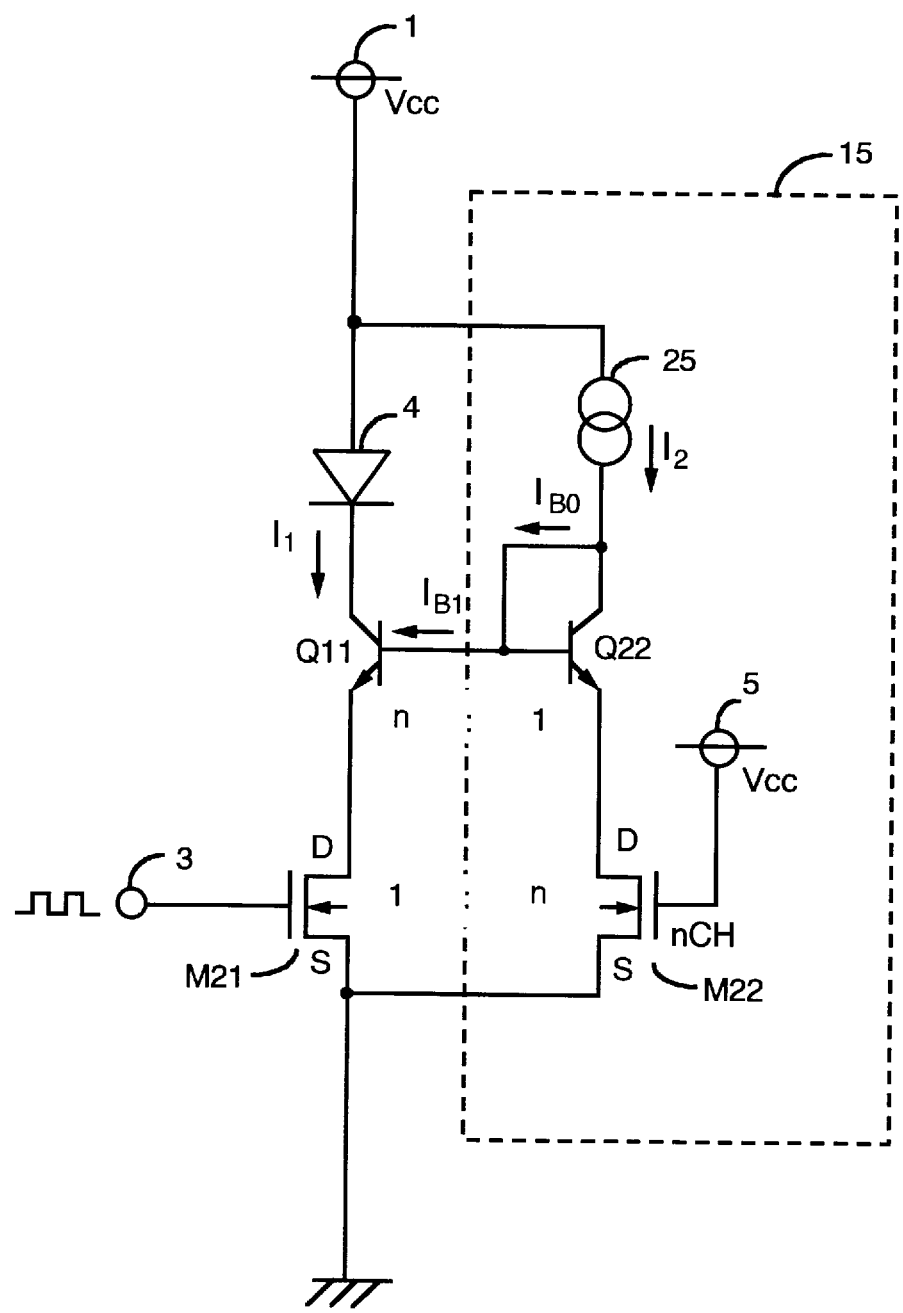
FIG. 2 shows a detailed circuit of the current switching circuit of FIG. 1.

FIG. 2 shows a detailed circuit of the current switching circuit of FIG. 1. In FIG. 2, the current switching circuit comprises a power supply 1, a bipolar transistor Q11, an n channel switching MOS transistor M21, a data input terminal 3 which receives a data signal which controls the gate of the switching MOS transistor M21, a laser diode 4 which is driven by the current flowing through the bipolar transistor Q11 and used in a printer, and a DC bias source 15 which controls the base current of the bipolar transistor Q11. The current switching circuit further comprises a bipolar transistor Q22 which, together with the bipolar transistor Q11, forms a current mirror circuit. By setting the current ratio between the bipolar transistor Q11 and the transistor Q22 to n:1, the current flowing through the bipolar transistor Q22 is adjusted to 1/n of that of the bipolar transistor Q11. Therefore, the bipolar transistor Q22 can be a small transistor through which a small amount of current flows. A constant current supply 25 provides the transistor Q22 with a constant current. One end of the constant current supply 25 is connected to the power supply 1, and the other end is connected to the collector electrode of the bipolar transistor Q22. The base electrode of the bipolar transistor Q22 is connected to the base electrode of the bipolar transistor Q11, and to the collector electrode of the bipolar transistor Q22. The gate electrode of the MOS transistor M22 receives a power supply voltage from power supply 5, and the drain electrode of the MOS transistor M22 is connected to the emitter electrode of the bipolar transistor Q22. A source electrode of the MOS transistor M22 is grounded.

The operation of the circuit of FIG. 2 is described below. In the circuit of the constant voltage DC bias source 15, since the gate electrode of the MOS transistor M22 constantly receives a positive voltage from the power supply 5, the MOS transistor M22 is always in the ON state. The MOS transistor M22 operates as a resistance element, and prevents current exceeding a predetermined amount from flowing into the bipolar transistor Q22. Since the collector electrode of the bipolar transistor Q22 is constantly provided with a constant current 12 from the constant current supply 25, the bipolar transistor Q22 is normally in the ON state. As stated above, since the current flowing through the bipolar transistor Q22 is 1/n of that of the bipolar transistor Q11, it is possible to reduce the current $I_2$, and to reduce unwanted power consumption. The resistance ratio between the MOS transistor M21 and the MOS transistor M22 is set to 1:n. In other words, the resistance value of the MOS transistor M21 is small and a large amount of a current is supplied to the laser diode 4. At the same time, the resistance value of the MOS transistor M22 is large and the current flowing into the bipolar transistor Q22 is small. Since the base electrode of the bipolar transistor Q22 is connected to the base electrode of the bipolar transistor Q11, the base electrode of the bipolar transistor Q11 always receives the same voltage as that of the bipolar transistor Q22.

Under such a condition, when a data signal containing the logic "H" is inputted into the data input terminal 3, the MOS transistor M21 turns on. Thereby the bipolar transistor Q11 also turns on and the driving current $I_1$ is provided into the laser diode 4.

On the other hand, when the data signal changes to a logic "L", the MOS transistor M21 turns off. Thereby the bipolar transistor Q11 also turns off, and the driving current $I_1$ which has been provided into the laser diode 4 is cut off.

In this manner, in the current switching circuit of the first embodiment, since the large current which drives the laser diode 4 is completely cut off when the data signals change to the logic "L", the unwanted consumption of power is reduced. Moreover, the MOS transistor M21 does not possess a large voltage between the base and the emitter like a conventional bipolar transistor, therefore, the dynamic range of the bipolar transistor Q11 can be widened.

Figure 15:
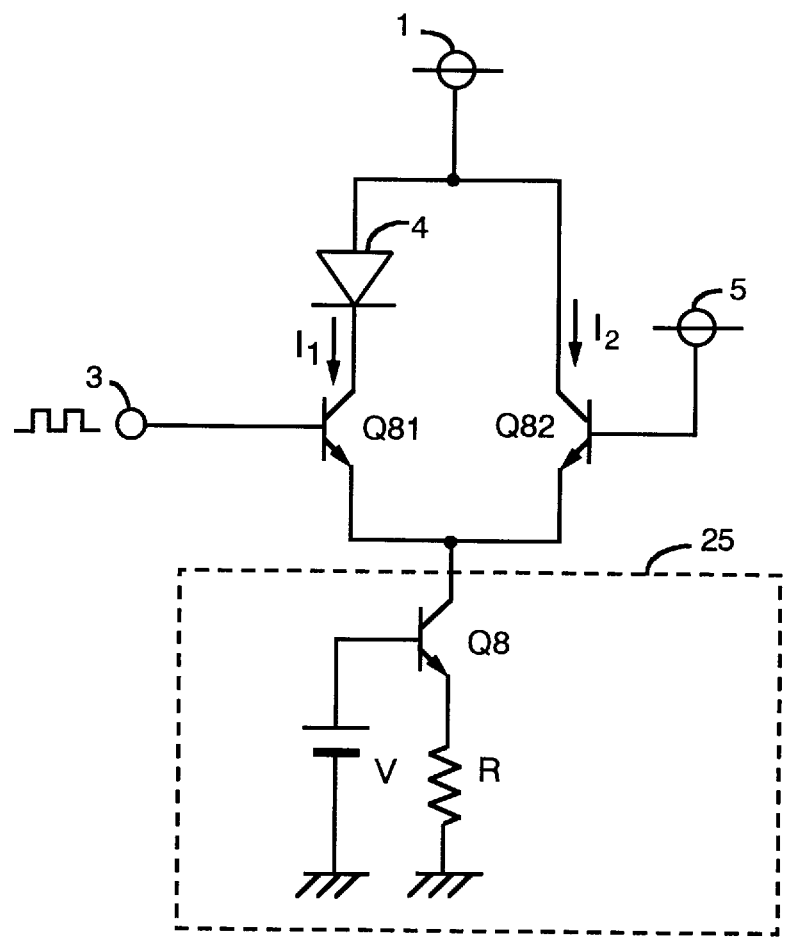
FIG. 15 shows a current switching circuit used for the LD driving circuit in the prior art.

For example, in a conventional circuit as shown in FIG. 15, the voltage between the collector and the emitter of the transistor Q8 is about 0.5 V and the voltage drop of resistance R is about 0.2 V and their total voltage drop is about 0.7 V. In contrast, in this invention, since the voltage between the drain and the source of the MOS transistors is about 0.2 V, compared with the voltage when the bipolar transistor is used, the dynamic range can be widened by approximately 0.5 V.

In addition, in the conventional circuit, since the voltage between the base and emitter of the transistor Q81, which is about 0.7 V, is added to the center electric potential of the data input terminal 3, the center electric potential of the data input is about 1.4V (=0.2+0.5+0.7). In contrast, in this invention, it is possible to reduce a central electric potential of the data input terminal 3 to approximately 0.4 V, which is equal to the voltage between the gate and the source. This voltage value 0.4 V is 1V lower than that of the conventional circuit.

Embodiment 2

Figure 3:
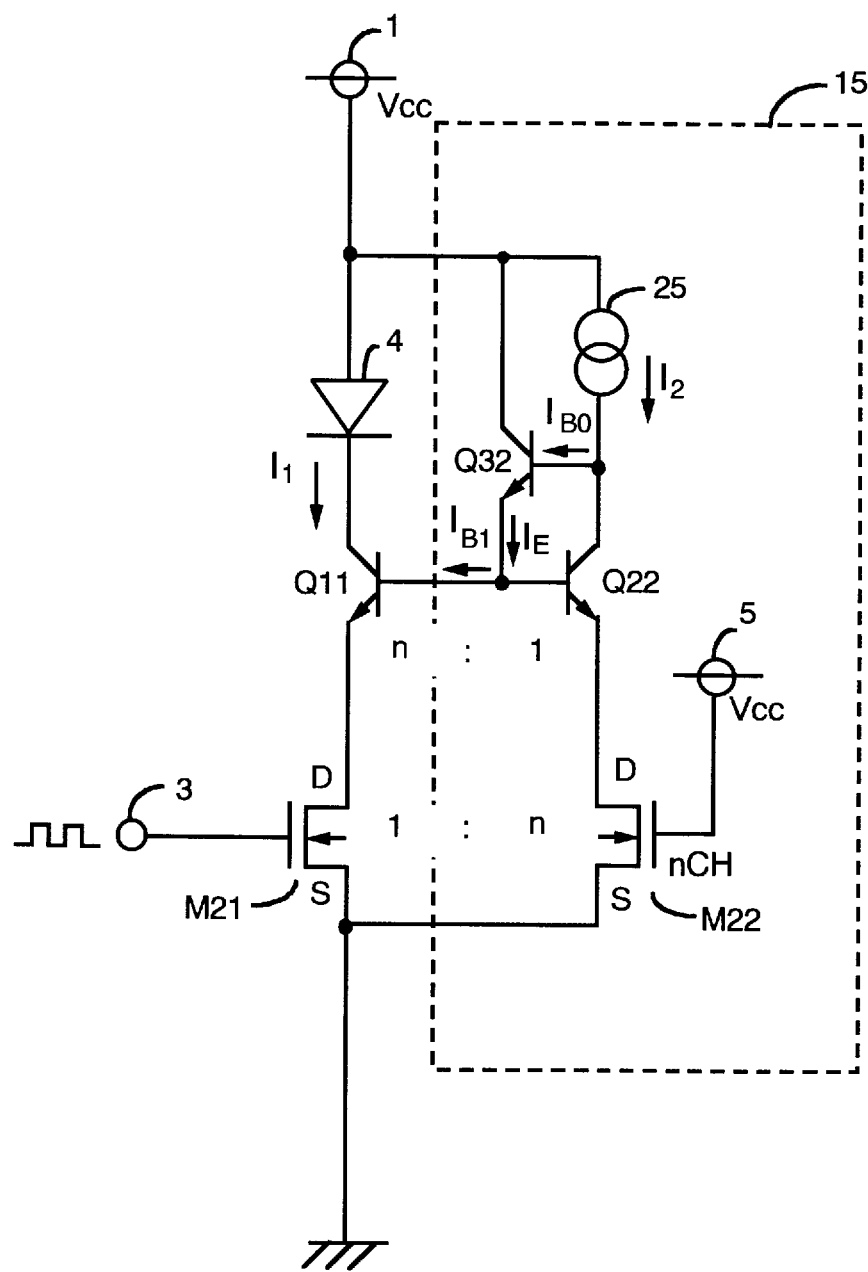
FIG. 3 shows a current switching circuit according to a second embodiment of the present invention.

FIG. 3 shows the current switching circuit according to a second embodiment of the present invention. In FIG. 3, a DC bias source 15 for controlling the base current of the bipolar transistor Q11, and other detailed circuits of the DC bias source 15 are illustrated. In FIG. 3, the main circuit including the load laser diode 4 and the bipolar transistor Q11 is same as that of FIG. 1, so the description thereof is herein omitted. In FIG. 3, a bipolar transistor Q22, together with the bipolar transistor Q11, forms a current mirror circuit. By setting the current ratio between the bipolar transistor Q11 and the bipolar transistor Q22 to n:1, the current flowing through the bipolar transistor Q22 is adjusted to 1/n of the current flowing through bipolar transistor Q11. Therefore, the bipolar transistor Q22 can be a small transistor which a small amount of current can flow through. The constant current supply 25 provides the transistor Q22 with a constant current. A bipolar transistor Q32 provides the bipolar transistor Q11 and the bipolar transistor Q22 with a base current. The collector of the bipolar transistor Q32 is connected to the power supply Vcc, and the emitter of the bipolar transistor Q22 is connected to the commonly connected bases of the bipolar transistor Q11 and the bipolar transistor Q22. The base electrode of the bipolar transistor Q22 is connected to the constant current supply 25. The collector electrode of the bipolar transistor Q22 is connected to the constant current supply 25, and the base electrode of the bipolar transistor Q22 is connected to the base electrode of the bipolar transistor Q11. The gate electrode of the MOS transistor M22 receives a positive voltage from the power supply 5, and the drain electrode is connected to the emitter electrode of the bipolar transistor Q22. The source electrode of the MOS transistor M22 is grounded.

The operation of FIG. 3 is described below. In a circuit of the constant voltage DC bias source 15, since the gate electrode of the MOS transistor M22 constantly receives a positive voltage from the power supply 5, the MOS transistor M22 is normally in the ON state. The MOS transistor M22 operates as a resistive element, and prevents current exceeding a predetermined amount from flowing into the bipolar transistor Q22. Since the collector electrode of the bipolar transistor Q22 is constantly provided with a constant current I2 from the constant current supply 25, the bipolar transistor Q22 is normally in the ON state. As stated above, since the current flowing through the bipolar transistor Q22 is 1/n of that of the bipolar transistor Q11, it is possible to reduce the current 12, which reduces unwanted power consumption. The resistance ratio between the MOS transistor M21 and the MOS transistor M22 is set to 1:n. In other words, since the resistance value of the MOS transistor M21 is small, a large amount of a current is supplied to the laser diode 4. At the same time, since the resistance value of the MOS transistor M22 is large, the current flowing into the bipolar transistor Q22 is small. Since the base electrode of the bipolar transistor Q22 is connected to the base electrode of the bipolar transistor Q11, the base electrode of the bipolar transistor Q11 normally receives the same voltage as that of the bipolar transistor Q22.

Like the circuit in the first embodiment, in a circuit where the base electrode and the collector electrode of the bipolar transistor Q22 are connected, if the current flowing through the base of the bipolar transistor Q22 is ignored, the current $I_{B1}$ supplied to the base electrode of the bipolar transistor Q11 is approximately equal to the current $I_{B0}$ supplied from the constant current supply 25, and therefore a relation $I_{B1}=I_{B2}$ is obtained. The current $I_{B1}$ is supplied to the base electrode of the bipolar transistor Q11, and the current $I_{B1}$ is about 1/10 of the current $I_2$ which is supplied to the bipolar transistor Q22. That is, the current $I_{B1}=I_{B0}=I_1/h_{fe}$, and $I_1=n\ I_2$, therefore the current $I_{B1}=I_{B0}=(n\ I_2/h_{fe})=I_2/10$, if n=10, $h_{fe}=100$. Thus, if the current $I_{B1}$ is provided directly from the constant current supply 25, the current $I_2$ fluctuates with of the current $I_{B1}$. As a result, the current mirror ratio also fluctuates, and so does the driving current $I_1$.

In the second embodiment, the bipolar transistor Q32 is provided, and a bias current is supplied from the emitter electrode of the bipolar transistor Q32 to the common base electrode of the bipolar transistor Q11 and the bipolar transistor Q22. The emitter electrode of the bipolar transistor Q32 supplies the base current to the bipolar transistor Q11 and the bipolar transistor Q22. If the current flowing through the base of the bipolar transistor Q22 (approximately $I_{B1}/n$) is ignored, the current $I_{B1}$ supplied to the base electrode of the bipolar transistor Q11 is substantially equal to the current $I_E$ which is supplied from the emitter of the bipolar transistor Q32, that is, $I_{B1}=I_E$. Alternatively, the base current $I_{B0}$ of the bipolar transistor Q32 becomes $1/h_{fe}$ of the emitter current $I_E$. Therefore, the fluctuation of the current $I_{B1}$ has a decreased effect on the current $I_2$.

In the second embodiment, the fluctuation of the current mirror ratio which is caused by the fluctuation of the base current of the bipolar transistor Q11 can be decreased, and therefore a constant current can be supplied to the laser diode 4. The reason is explained below. Since $I_{B0}=I_E/h_{fe}=I_{B1}/h_{fe}$ in the bipolar transistor Q32, and $I_{B1}=I_1/h_{fe}, I_1=n\ I_2$, the ratio $I_{B0}/I_2$ is obtained as follows, where the $I_2$ denotes a current flowing through the bipolar transistor Q22 and $I_{B1}$ $(=I_{B0})$ denotes a current flowing through the base of the bipolar transistor Q11.

$$I_{B0}/I_2=n\ I_{B0}/I_1=n\ I_E/I_1 h_{fe}=n\ I_{B1}/I_1 h_{fe}=n\ I_1/I_1 h_{fe}\times h_{fe}=n/(h_{fe}\times h_{fe})$$

Therefore, if the current mirror ratio is 10 and the $h_{fe}$ of the transistor is 100, the fluctuation ratio $I_{B0}/I_2$ is 1/1000. In this manner, by providing the bipolar transistor Q32, the fluctuation ratio $I_{B0}/I_2$ changes from 1/10 to 1/1000. Therefore it is possible to provide a constant current to the laser diode 4.

When the data input terminal 3 is supplied with the data signals of a logic "H", the MOS transistor M21 turns on.

Thereby, the bipolar transistor Q11 also turns on and provides the driving current $I_1$ to the laser diode 4.

In contrast when the data signal changes to a logic "L", the MOS transistor M21 turns off. Thereby the bipolar transistor Q11 also turns off and the driving current $I_1$ is cut off.

In this manner, in the current switching circuit of the second embodiment, when the data signal changes to the logic "L", the large current which drives the laser diode 4 is completely cut off. On the other hand, although the current in the bipolar transistor Q22 keeps flowing, since the current is small, the power consumption of the current switching circuit as a whole can be small. Further, the MOS transistor M21 does not have a large voltage between the base and the emitter like a conventional bipolar transistor; therefore, the dynamic range of the bipolar transistor Q11 is increased.

For example, in a conventional circuit as shown in FIG. 15, the voltage between the collector and the emitter of the transistor Q8 is about 0.5 V and the voltage drop of resistance R is about 0.2 V and their total voltage drop is about 0.7 V. In contrast, in this invention, since the voltage between the drain and the source of the MOS transistors is about 0.2 V, compared with the voltage when the bipolar transistor is used, the dynamic range can be widened by approximately 0.5 V.

In addition, in the conventional circuit, since the voltage between the base and emitter of the transistor Q81, which is about 0.7 V, is added to the center electric potential of the data input terminal 3, the center electric potential of the data input is about 1.4V (=0.2+0.5+0.7). In contrast, in this invention, it is possible to reduce the central electric potential of the data input terminal 3 to approximately 0.4 V, which is equal to the voltage between the gate and the source. This voltage value of 0.4 V is 1V lower than that of the conventional circuit Further, since a third bipolar transistor Q32 of the npn, type whose collector electrode is connected to a power supply, whose emitter electrode is connected to a base electrode of a bipolar transistor Q11 of the npn type, and whose base electrode is connected to the constant current supply is provided, when the bipolar transistor Q11 is activated, a drastically changing base current can be supplied to the base of the bipolar transistor Q11 via the bipolar transistor Q32. Thus, in addition to the invention of the first embodiment, distortion of the waveform can be prevented when the driving current flowing through the laser diode 4 is rising.

Embodiment 3

Figure 4:
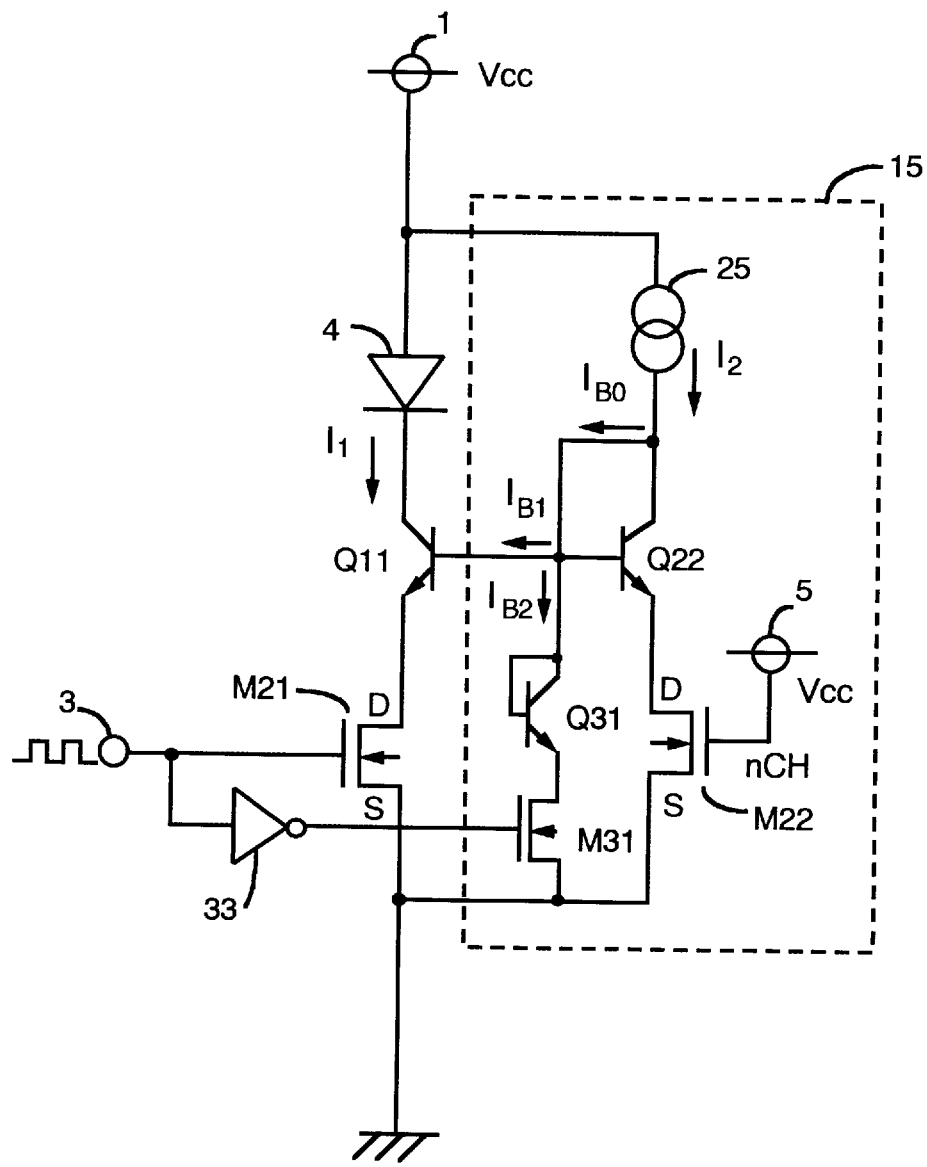
FIG. 4 shows a current switching circuit according to a third embodiment of the present invention.

FIG. 4 shows the current switching circuit according to a second embodiment of the present invention. In FIG. 4, a DC bias source 15 for controlling the base current of the bipolar transistor Q11, and other detailed circuits of the DC bias source 15 are illustrated. In FIG. 4, the main circuit including the load laser diode 4 and the bipolar transistor Q11 is same as that of FIG. 1, so the description thereof is herein omitted. In FIG. 4, a bipolar transistor Q22 forms a current mirror circuit together with the bipolar transistor Q11. By setting the current ratio between the bipolar transistor Q11 and the bipolar transistor Q22 to n:1, the current flowing through the bipolar transistor Q22 is adjusted to 1/n of the bipolar transistor Q11. Therefore, the bipolar transistor Q22 can be a small transistor which a small amount of current can flow through. The constant current supply 25 provides the transistor 22 with a constant current. The collector electrode of the bipolar transistor Q22 is connected to the constant current supply 25. The base electrode of the bipolar transistor Q22 is connected to the base electrode of the bipolar transistor Q11 and also to the collector of the bipolar transistor Q22. The gate electrode of the MOS transistor M22 receives a positive voltage from the power supply 5, and the drain electrode is connected to the emitter electrode of the bipolar transistor Q22. The source electrode of the MOS transistor M22 is grounded.

A bipolar transistor Q31 is connected to an MOS transistor M31 in series. The MOS transistor M31 is wired so that it turns on when the MOS transistor M21 turns off. A collector electrode of bipolar transistor Q31 is connected to the common base electrode of bipolar transistor Q11 and bipolar transistor Q22, and the collector electrode of and the base electrode of bipolar transistor Q31 are connected to each other. The emitter electrode of the bipolar transistor Q31 is connected to the drain electrode of the MOS transistor M31. A source electrode of the MOS transistor M31 is grounded. The signal from the input terminal 3 is inverted by the inverter 33, and the inverted signal is applied to a gate electrode of the MOS transistor M31.

The operation of FIG. 4 is described below. In the constant voltage DC bias source 15, since the gate electrode of the MOS transistor M22 constantly receives a positive voltage from the power supply 5, the MOS transistor M22 is normally ON. The MOS transistor M22 operates as a resistance element, and prevents current exceeding a predetermined amount from flowing into the bipolar transistor Q22. Since the collector electrode of the bipolar transistor Q22 constantly receives a constant current $I_2$ from the constant current supply 25, the bipolar transistor Q22 is normally ON. As stated above, since the current flowing through the bipolar transistor Q22 is 1/n of that of the bipolar transistor Q11, it is possible to reduce the current $I_2$, which reduces unwanted power consumption. The resistance ratio between the MOS transistor M21 and the MOS transistor M22 is set to 1:n.

In other words, since the resistance value of the MOS transistor M21 is small, a large amount of a current is supplied to the laser diode 4. At the same time, the resistance value of the MOS transistor M22 is large and the current flowing into the bipolar transistor Q22 is small. The base electrode of the bipolar transistor Q22 is connected to the base electrode of the bipolar transistor Q11, and the base current is constantly provided to these common base electrodes by the constant current supply 25. An input signal is directly applied to the gate electrode the MOS transistor M21, while an inverted input signal via the inverter 33 is applied to the gate electrode of the transistor M31. When the input signal is the logic "H", the logic "L" is inputted into the gate of the MOS transistor M31, therefore when the MOS transistor M21 turns on, the MOS transistor M31 turns off. On the other hand, when the input signal is logic "L", the gate of the MOS transistor M31 receives the logic "H". Therefore the MOS transistor M21 turns off and the MOS transistor M31 turns on.

In such a condition, when a data signal of logic "H" is inputted into the data input terminal 3, the MOS transistor M21 turns on. Thereby, the bipolar transistor Q11 also turns on and provides the driving current $I_1$ to the laser diode 4. At this time, the series circuit of the bipolar transistor Q31 and the MOS transistor M31 turns off, and the current is not supplied thereto.

On the other hand, when the data signal changes to logic "L", the MOS transistor M21 turns off. Thereby, the bipolar transistor Q11 also turns off, and the driving current $I_1$ is cut off. At this time, the series circuit of the bipolar transistor Q31 and transistor M31 turns on. Therefore, the charge stored in the base of the bipolar transistor Q22 discharges to the ground via this series circuit of the bipolar transistor Q31 and transistor M31. Accordingly, it is possible to speed up the switching speed (falling speed) of the bipolar transistor Q11, and to reduce the distortion of the current waveform of the current $I_1$ at the moment of falling.

Figure 7:
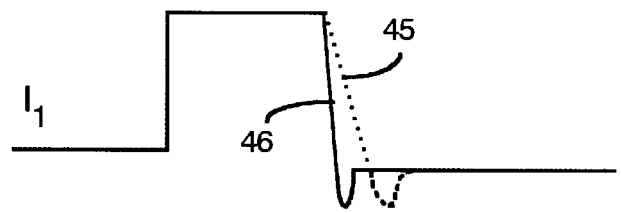
FIG. 7 shows a failing waveform of the current I1 at the moment of switching in the third embodiment through the fifth embodiment of the present invention.

FIG. 7 shows one example of this waveform. FIG. 7 shows a waveform of the current $I_1$ at the moment of the switching in the third embodiment of this invention. In the conventional current switching circuit, the charge remains in the base even after bipolar transistor Q11 turns off when the input signal frequency is high, and therefore it is difficult to recombine the charge instantaneously. As a result, when the current waveform changes from the logic "H" state to a logic "L" state, the current waveform causes delay as shown by the reference number 45 in FIG. 7. Because of the delay, the response of the current $I_1$ is slow, and the driving current $I_1$ which is provided to the laser diode 4 is distorted. According to the third embodiment of the invention, however, the charge remaining in the base when bipolar transistor Q11 turns off is recombined instantaneously by the series circuit of the bipolar transistor Q31 and the MOS transistor M31. Therefore, the delay of the driving current $I_1$ rarely happens, as shown by the reference number 46 in FIG. 7. Since the delay rarely happens, the driving current $I_1$ which flows through the laser diode 4 does not get distorted.

In the current switching circuit according to the third embodiment, the large current which drives the laser diode 4 is completely cut off when the data signal changes to logic "L". On the other hand, the current in the bipolar transistor Q22 keeps flowing. But, since the current is small, it is possible to reduce unwanted power consumption. Since the bipolar transistor Q31 and the MOS transistor M31 are provided, the waveform of the driving current flowing through the laser diode 4 does not get distorted. Further, since the MOS transistor M21 does not have a large voltage between the base and the emitter like that of a conventional bipolar transistor, the dynamic range of the bipolar transistor Q11 is widened.

For example, in a conventional circuit as shown in FIG. 15, the voltage between the collector and the emitter of the transistor Q8 is about 0.5 V and the voltage drop of resistance R is about 0.2 V and their total voltage drop is about 0.7 V. In contrast, in this invention, since the voltage between the drain and the source of the MOS transistors is about 0.2 V, compared with the voltage when the bipolar transistor is used, the dynamic range can be widened by approximately 0.5 V.

In addition, in the conventional circuit, since the voltage between the base and emitter of the transistor Q81, which is about 0.7 V, is added to the center electric potential of the data input terminal 3, the center electric potential of the data input is about 1.4V (=0.2+0.5+0.7). In contrast, in this invention, it is possible to reduce a central electric potential of the data input terminal 3 to approximately 0.4 V, which is equal to the voltage between the gate and the source. This voltage value 0.4 V is 1V lower than that of the conventional circuit.

Embodiment 4

Figure 5:
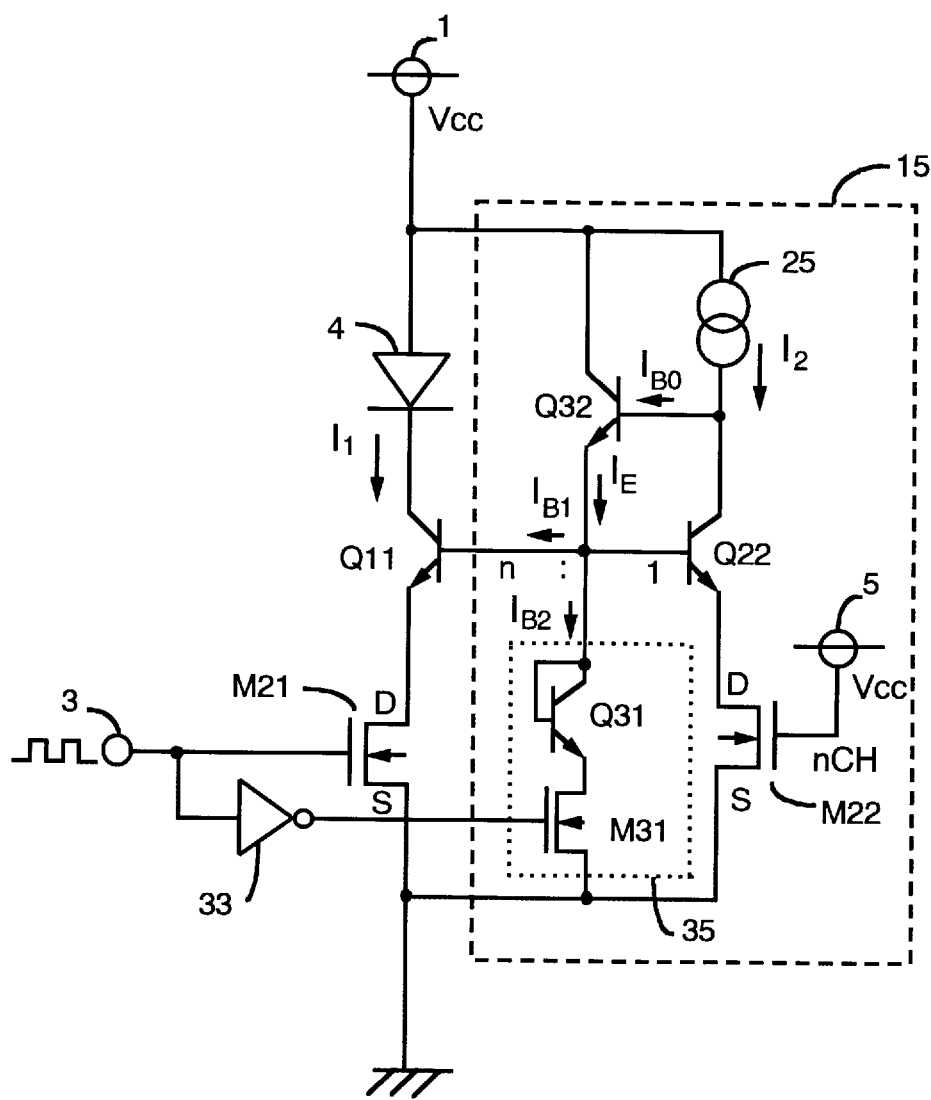
FIG. 5 shows a current switching circuit according to a fourth embodiment of the present invention.

FIG. 5 shows the current switching circuit according to a fourth embodiment of the present invention. In FIG. 5, a DC bias source 15 for controlling the base current of the bipolar transistor Q11, and other detailed circuits of the DC bias source 15 are illustrated. In FIG. 5, the main circuit including the load laser diode 4 and the bipolar transistor Q11 is same as that of FIG. 1, so the description thereof is herein omitted. In FIG. 5, a bipolar transistor Q22 forms a current mirror circuit together with the bipolar transistor Q11. By setting the current ratio between the bipolar transistor Q11 and the bipolar transistor Q22 to n:1, the current flowing through the bipolar transistor Q22 is adjusted to 1/n of the current flowing through the bipolar transistor Q11. Therefore, the bipolar transistor Q22 can be a small transistor which a small amount of current can flow through. The constant current supply 25 provides the transistor 22 with a constant current. The collector electrode of the bipolar transistor Q22 is connected to the constant current supply 25. The base electrode of the bipolar transistor Q22 is connected to the base electrode of the bipolar transistor Q11.

A bipolar transistor Q32 provides the bipolar transistor Q11 and the bipolar transistor Q22 with the base current. A collector of the bipolar transistor Q32 is connected to the power supply Vcc, and the emitter of the bipolar transistor Q22 is connected to the common base connection of the bipolar transistor Q11 and the bipolar transistor Q22. The base electrode of the bipolar transistor Q22 is connected to the constant current supply 25. The collector electrode of the bipolar transistor Q22 is connected to the constant current supply 25, and the base electrode of the bipolar transistor Q22 is connected to the base electrode of the bipolar transistor Q11. The gate electrode of the MOS transistor M22 receives a positive voltage from the power supply 5, and the drain electrode is connected to the emitter electrode of the bipolar transistor Q22. The source electrode of the MOS transistor M22 is grounded. A bipolar transistor Q31 is connected in series with a MOS transistor M31. The MOS transistor M31 is wired so that it turns on when the MOS transistor M21 turns off. The collector electrode of bipolar transistor Q31 is connected to the common base electrode of bipolar transistor Q11 and bipolar transistor Q22, and the collector electrode of and the base electrode of bipolar transistor Q31 are connected to each other. The emitter electrode of the bipolar transistor Q31 is connected to the drain electrode of the MOS transistor M31. A source electrode of the MOS transistor M31 is grounded. The signal from the input terminal 3 is inverted by the inverter 33, and the inverted signal is applied to a gate electrode of the MOS transistor M31.

The operation of the circuit of FIG. 5 is described below. In the constant voltage DC bias source 15, since the gate electrode of the MOS transistor M22 constantly receives a positive voltage from the power supply 5, the MOS transistor M22 is normally ON. The MOS transistor M22 operates as a resistance element, and prevents current exceeding a predetermined amount from flowing into the bipolar transistor Q22. Since the collector electrode of the bipolar transistor Q22 constantly receives a constant current I2 from the constant current supply 25, the bipolar transistor Q22 is normally ON. As stated above, since the current flowing through the bipolar transistor Q22 is 1/n of that of the bipolar transistor Q11, it is possible to reduce the current $I_2$, which reduces unwanted power consumption. The resistance ratio between the MOS transistor M21 and the MOS transistor M22 is set to 1:n. In other words, since the resistance value of the MOS transistor M21 is small, a large amount of a current is supplied to the laser diode 4. At the same time, the resistance value of the MOS transistor M22 is large and the current flowing into the bipolar transistor Q22 is small.

Like the circuit in the third embodiment, in a circuit where the base electrode and the collector electrode of the bipolar transistor Q22 are connected, if the current flowing through the base of the bipolar transistor Q22 is ignored, the current $I_{B1}$ supplied to the base electrode of the bipolar transistor Q11 is approximately equal to the current $I_{B0}$ supplied from the constant current supply 25, and therefore a relation $I_{B1}$ $=I_{B2}$ is obtained. The current $I_{B1}$ is supplied to the base electrode of the bipolar transistor Q11, and the current $I_{B1}$ is about 1/10 of the current $I_2$ which is supplied to the bipolar transistor Q22. That is, the current $I_{B1}=I_{B0}=I_1/h_{fe}$, and $I_1=n\ I_2$, therefore the current $I_{B1}=I_{B0}=(n\ I_2/h_{fe})=I_2/10$, if $n=10$, $h_{fe}=100$. Thus, if the current $I_{B1}$ is provided directly from the constant current supply 25, the current $I_2$ fluctuates by fluctuation of the current $I_{B1}$. The current mirror ratio also fluctuates, and so does the driving current $I_1$.

In the fourth embodiment, the bipolar transistor Q32 is provided, and a bias current is supplied from the emitter electrode of the bipolar transistor Q32 to the common base electrode of the bipolar transistor Q11 and the bipolar transistor Q22. The emitter electrode of the bipolar transistor Q32 supplies the base current to the bipolar transistor Q11 and the bipolar transistor Q22. If the current flowing through the base of the bipolar transistor Q22 (approximately $I_{B1}/n$) is ignored, the current $I_{B1}$ supplied to the base electrode of the bipolar transistor Q11 is substantially equal to the current $I_E$ which is supplied from the emitter of the bipolar transistor Q32, that is, $I_{B1}=I_E$. Alternatively, the base current $I_{B0}$ of the bipolar transistor Q32 becomes $1/h_{fe}$ of the emitter current $I_E$. Therefore, the fluctuation of the current $I_{B1}$ influences the current $I_2$ less.

In the fourth embodiment, the fluctuation of the current mirror ratio which is caused by the fluctuation of the base current of the bipolar transistor Q11 can be decreased, and therefore a constant current can be supplied to the laser diode 4. The reason is explained below. Since $I_{B0}=I_E/h_{fe}=I_{B1}/h_{fe}$ in the bipolar transistor Q32, and $I_{B1}=I_1/h_{fe}$, $I_1=n\ I_2$, the ratio $I_{B0}/I_2$ is obtained as follows, where $I_2$ denotes a current flowing through the bipolar transistor Q22 and $I_{B1}$ ($=I_{B0}$) denotes a current flowing through the base of the bipolar transistor Q11.

$$I_{B0}/I_2 = n\ I_{B0}/I_1 = n\ I_E/I_1 h_{fe} = n\ I_{B1}/I_1 h_{fe} = n\ I_1/I_1 h_{fe} \times h_{fe} = n/(h_{fe} \times h_{fe})$$

Therefore, if the current mirror ratio is 10 and the $h_{fe}$ of the transistor is 100, the fluctuation ratio $I_{B0}/I_2$ is 1/1000. In this manner, by providing the bipolar transistor Q32, the fluctuation ratio $I_{B0}/I_2$ changes from 1/10 to 1/1000. Therefore it is possible to provide a constant current to the laser diode 4.

The input signal is directly applied to the gate of the MOS transistor M21, while an inverted input signal via inverter 33 is applied to the gate of the MOS transistor M31. Therefore, when the input signal is logic "H", logic "L" is inputted into the gate of the MOS transistor M31. Accordingly when the MOS transistor M21 turns on, the MOS transistor M31 is turns off. On the other hand, when the input signal is logic "L", logic "H" is inputted to the gate of the MOS transistor M31. Therefore, when the MOS transistor M21 turns off, the MOS transistor M31 turns on.

When the data input terminal 3 is supplied with the data signals of a logic "H", the MOS transistor M21 turns on. Thereby, the bipolar transistor Q11 also turns on and provides the driving current $I_1$ to the laser diode 4. At this time, the series circuit of the bipolar transistor Q31 and the MOS transistor M31 is turned off, and the current does not flow through the laser diode 4.

On the other hand, when the data signal changes to logic "L", the MOS transistor M21 turns off. Thereby, the bipolar transistor Q11 also turns off, and the driving current $I_1$ is cut off. At this time, the series circuit of the bipolar transistor Q31 and transistor M31 turns on. Therefore, the charge stored in the base of the bipolar transistor Q22 discharges to the ground via the series circuit of the bipolar transistor Q31 and transistor M31. Accordingly, it is possible to increase up the switching speed (falling speed) of the bipolar transistor Q11, and to reduce the distortion of the current waveform of the current $I_1$ at the moment of failing.

FIG. 7 shows one example of this waveform. FIG. 7 shows a waveform of the current $I_1$ at the moment of the switching in the fourth embodiment of this invention. In the conventional current switching circuit, the charge remains in the base even after bipolar transistor Q11 turns off when the input signal frequency is high, and therefore it is difficult to recombine the charge instantaneously. As a result, when the current waveform changes from the logic "H" state to a logic "L" state, the current waveform causes a delay as shown by the reference number 45 in FIG. 7. Because of the delay, the response of the current $I_1$ is slow, and the driving current $I_1$ which is provided to the laser diode 4 is distorted. According to the fourth embodiment of the invention, however, the charge remaining in the base at the time of bipolar transistor Q11 turns off is recombined instantaneously by the series circuit of the bipolar transistor Q31 and the MOS transistor M31. Therefore, the delay of the driving current $I_1$ rarely happens, as shown by the reference number 46 in FIG. 7. Since the delay rarely happens, the driving current $I_1$ which flows through the laser diode 4 does not get distorted.

In this manner, in the current switching circuit according to the fourth embodiment, the large current which drives the laser diode 4 is completely cut off when the data signal changes to logic "L". On the other hand, the current in the bipolar transistor Q22 keeps flowing. But, since the current is small, it is possible to reduce unwanted power consumption. Since the bipolar transistor Q31 and the MOS transistor M31 are provided, the waveform of the driving current flowing through the laser diode 4 does not get distorted. Further, since the MOS transistor M21 does not have a large voltage between the base and the emitter unlike that of the conventional bipolar transistor, the dynamic range of the bipolar transistor Q11 can be widened.

For example, in a conventional circuit as shown in FIG. 15, the voltage between the collector and the emitter of the transistor Q8 is about 0.5 V and the voltage drop of resistance R is about 0.2 V and their total voltage drop is about 0.7 V. In contrast, in this invention, since the voltage between the drain and the source of the MOS transistors is about 0.2 V, compared with the voltage when the bipolar transistor is used, the dynamic range can be widened by approximately 0.5 V.

In addition, in the conventional circuit, since the voltage between the base and emitter of the transistor Q81, which is about 0.7 V, is added to the center electric potential of the data input terminal 3, the center electric potential of the data input is about 1.4V (=0.2+0.5+0.7). In contrast, in this invention, it is possible to reduce a central electric potential of the data input terminal 3 to approximately 0.4 V, which is equal to the voltage between the gate and the source. This voltage value 0.4 V is 1V lower than that of the conventional circuit.

Embodiment 5

Figure 6:
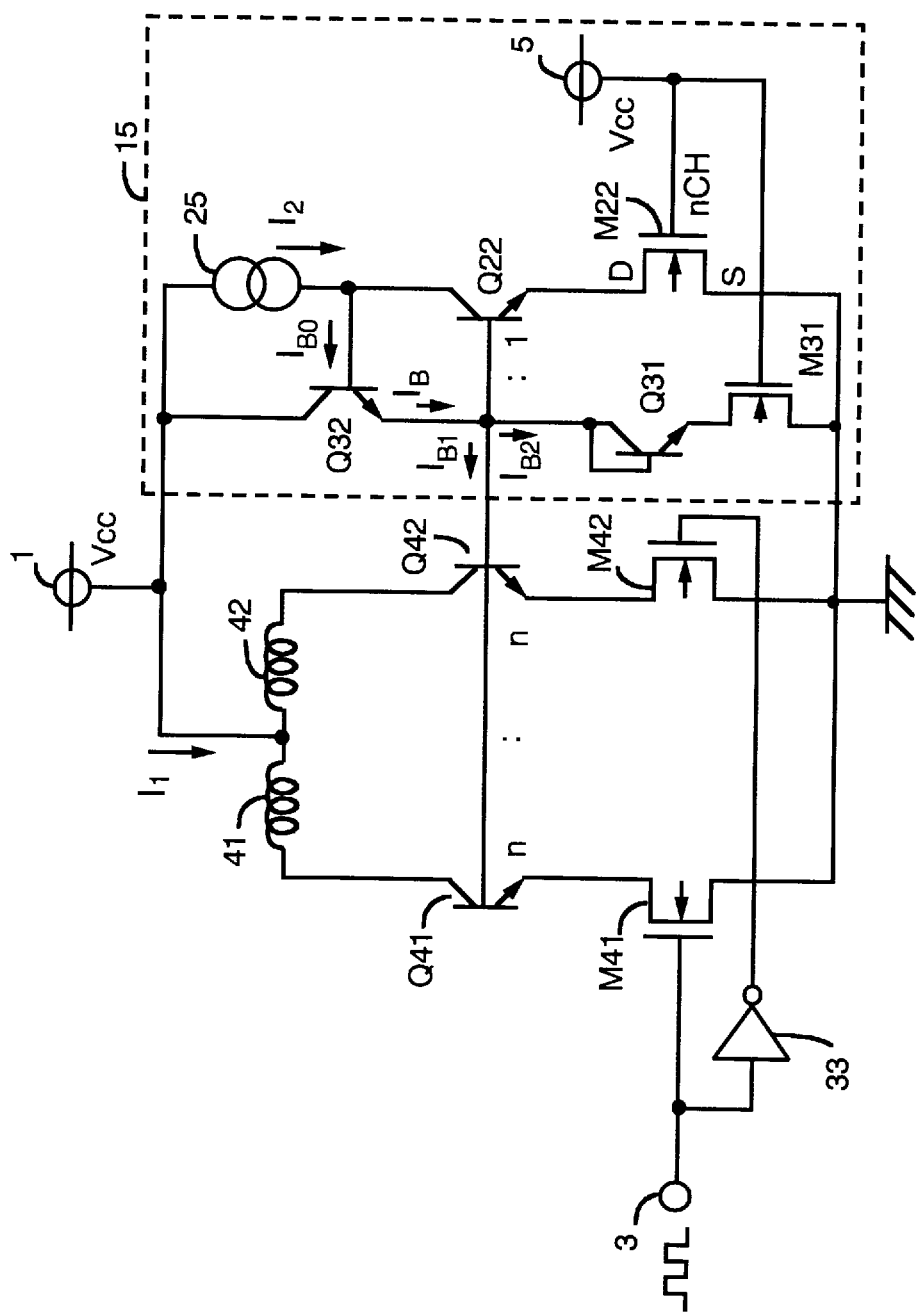
FIG. 6 shows the current switching circuit according to a fifth embodiment of the invention.

FIG. 6 shows a current switching circuit in a fifth embodiment of this invention. FIG. 6 shows an example in which the current switching circuit drives an inductance load such as a magnetic head coil. In FIG. 6, the current switching circuit comprises a DC bias source 15 which controls the base current of the bipolar transistors Q41 and Q42. The DC bias source 15 in the FIG. 6 can be replaced by the other circuits shown in FIG. 2~FIG. 4.

In FIG. 6, a bipolar transistors Q41 and Q42 constitute a current mirror circuit with the bipolar transistor Q22. By setting the current ratio between the bipolar transistor Q41, the bipolar transistor Q42 and the bipolar transistor Q22 to n:n:1, the current flowing through the bipolar transistor Q22 is adjusted to 1/n of those currents flowing through the transistors Q41 and Q42. Therefore, the bipolar transistor Q22 may be a small capacity transistor in which a small amount of current flows. The inductance loads 41 and 42 are exemplified by a coil of a magnetic head. The collector of the bipolar transistor Q41 is connected to the power supply 1 via the inductor 41. The emitter of the bipolar transistor Q41 is connected to the drain of the MOS transistor M41, and the source of the MOS transistor M41 is grounded. The gate of the MOS transistor M41 is connected to the data input terminal 3.

On the other hand, the collector of the bipolar transistor Q42 is connected to the power supply 1 via inductor 42. The emitter of the bipolar transistor Q42 is connected to the drain of the MOS transistor M42, and the source of the MOS transistor M42 is grounded. The gate of the MOS transistor M42 is connected to the data input terminal 3 via an inverter 33. The constant current supply 25 provides a constant current to the bipolar transistor Q22. The collector electrode of the bipolar transistor Q22 is connected to the constant current supply 25, and the base electrode of the bipolar transistor Q22 is connected to the base electrode of the transistors Q41 and Q42.

The bipolar transistor Q32 provides a base current to the transistors Q41, Q42 and Q22. The collector electrode of the bipolar transistor Q32 is connected to the power supply Vcc, and the emitter electrode of the bipolar transistor Q32 is connected to the common base electrode of the transistors Q41, Q42 and Q22. The base electrode of the bipolar transistor Q32 is connected to the constant current supply 25. The gate electrode of the MOS transistor M22 receives the power supply voltage from the power supply 5, and the drain electrode of the MOS transistor M22 is connected to the emitter electrode of the bipolar transistor Q22. The source electrode of the MOS transistor M22 is grounded.

The bipolar transistor Q31 and the MOS transistor M31 are connected in series. The collector electrode of the bipolar transistor Q31 is connected to the common base connection of the bipolar transistor Q42 and the bipolar transistor Q22. The base electrode and the collector electrode of the bipolar transistor Q31 are connected to each other, and the emitter electrode of the bipolar transistor Q31 is connected to the drain electrode of the MOS transistor M31. The source electrode of the MOS transistor M31 is grounded, and the gate electrode of the MOS transistor M31 is connected to the power supply 5.

The operation of FIG. 6 will be explained below. In the constant voltage DC bias source 15, since the positive voltage is constantly applied to the gate electrode of the MOS transistor M22 from the power supply 5, the MOS transistor M22 is normally ON. The MOS transistor M22 operates as a resistance element, and prevents current exceeding a predetermined amount from flowing into the bipolar transistor Q22. Since the collector electrode of the bipolar transistor Q22 is constantly provided with constant current $I_2$ from the constant current supply 25, the bipolar transistor Q22 is normally ON. As stated above, since the current flowing through the bipolar transistor Q22 is 1/n of the current flowing through the transistors Q41 and Q42, it is possible to reduce the current $I_2$, which reduces unwanted power consumption. The resistance ratio between the MOS transistor M41, M42 and the MOS transistor M22 is set to be 1:1: n. In other words, since the resistance value of the MOS transistors M41 and 42 is small, a large amount of current is supplied to the coils of magnetic heads 41 and 42.

At the same time, the resistance of the MOS transistor M22 is large and the current flowing into the bipolar transistor Q22 is small.

The base electrodes of the transistors Q41, Q42, and Q22 are connected to the emitter of the bipolar transistor Q32, and the base current is constantly supplied from the bipolar transistor Q32 to their common bases. The collector of the bipolar transistor Q31 is connected to the base of the bipolar transistor Q22 and the base of the bipolar transistor Q31, and the emitter of the bipolar transistor Q31 is connected to the drain of the MOS transistor M31. The source of the MOS transistor M31 is grounded, and the gate of the MOS transistor M31 is connected to the power supply 5. Therefore, the MOS transistor M31 is normally ON, thus the series circuit of the bipolar transistor Q31 and the MOS transistor M31 is normally ON.

In such a state, when the data signal which has the logic "H" is inputted into the input terminal 3, the MOS transistor M41 turns on. Thereby, the bipolar transistor Q41 also turns on and supplies the driving current $I_1$ to the inductor 41. At this time, since the MOS transistor M41 turns off, the series circuit of the bipolar transistor Q42 and the MOS transistor M42 is cut off, and current does not flow through the series circuit.

In contrast, when the data signal changes to logic "L", the MOS transistor M41 turns off. Thereby, the bipolar transistor Q41 also turns off, and the driving current $I_1$ supplied to the inductor 41 is cut off. On the other hand, when the MOS transistor M42 turns on, the bipolar transistor Q42 also turns on and the driving current $I_1$, supplied the inductor 41, is switched to the inductor 42. At this time, the base of the bipolar transistor Q41 needs to be abruptly supplied with the base current. In contrast, the electrical charge stored in the base of the bipolar transistor Q41 needs to be abruptly discharged to the ground.

Since the bipolar transistor Q32 provides the base current when the transistors Q41 and Q42 turn on, the waveform of the driving current flowing through the laser diode 4 can be prevented from the distortion caused by the rising of the driving current. In contrast, the electric charge stored in the bases of the transistors Q41 and Q42 when they turn off can be abruptly discharged to the ground via the transistors Q31 and M31. Thus, according to the fifth embodiment, the switching speed between the transistors Q41 and Q42 becomes faster, and the distortion of the current waveform when the driving current $I_1$ is falling is reduced. One example of this waveform is illustrated by the reference number 46 as shown in FIG. 7, in the same manner as in the third and fourth embodiments.

Figure 8A:
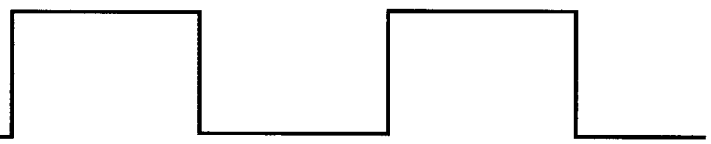
FIG. 8A shows an input voltage applied to the input signal terminal.
Figure 8B:
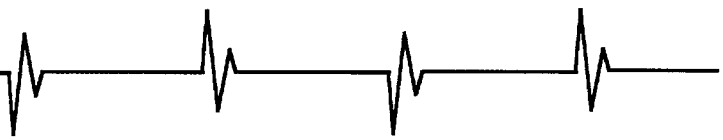
FIG. 8B shows pulses at rising and falling edges of the input signal of conventional switching circuits.
Figure 8C:
FIG. 8C shows pulses at rising and failing edges of the input signal of the present invention.

FIG. 8A illustrates an input voltage applied to the input signal terminal. FIG. 8B illustrates pulses caused at rising and falling of the input signal which flows in the transistors Q81 or the bipolar transistor Q82 when the transistors Q81 and Q82 are switched. FIG. 8C illustrates pulses caused at rising and falling of the input signal which flows in the transistor Q41 or the bipolar transistor Q42 when the transistors Q41 and Q42 are switched in the fifth embodiment of FIG. 6. As described above, in the circuit of FIG. 6, distortion of the current waveform can be reduced at the time of both rising and failing of the input signal.

In the current switching circuit according to the fifth embodiment, when the MOS transistors M41 and M42 turn off, the large currents which drive the inductor 41 and the inductor 42 are respectively cut off completely. In contrast, the current in the bipolar transistor Q22 continues to flow. But it is possible to reduce the power consumption in the current switching circuit as a whole, since the current in the Q22 is small. Further, since each MOS transistor M41 and M42 does not have a large voltage between the base and the emitter unlike the conventional bipolar transistor, the dynamic range of the bipolar transistor Q41 and Q42 can be widened.

For example, in a conventional circuit as shown in FIG. 15, the voltage between the collector and the emitter of the transistor Q8 is about 0.5 V and the voltage drop of resistance R is about 0.2 V and their total voltage drop is about 0.7 V. In contrast, in this invention, since the voltage between the drain and the source of the MOS transistors is about 0.2 V, compared with the voltage when the bipolar transistor is used, the dynamic range can be widened by approximately 0.5 V.

In addition, in the conventional circuit, since the voltage between the base and emitter of the transistor Q81, which is about 0.7 V, is added to the center electric potential of the data input terminal 3, the center electric potential of the data input is about 1.4V (=0.2+0.5+0.7). In contrast, in this invention, it is possible to reduce a central electric potential of the data input terminal 3 to approximately 0.4 V, which is equal to the voltage between the gate and the source. This voltage value 0.4 V is 1V lower than that of the conventional circuit.

Embodiment 6

Figure 9:
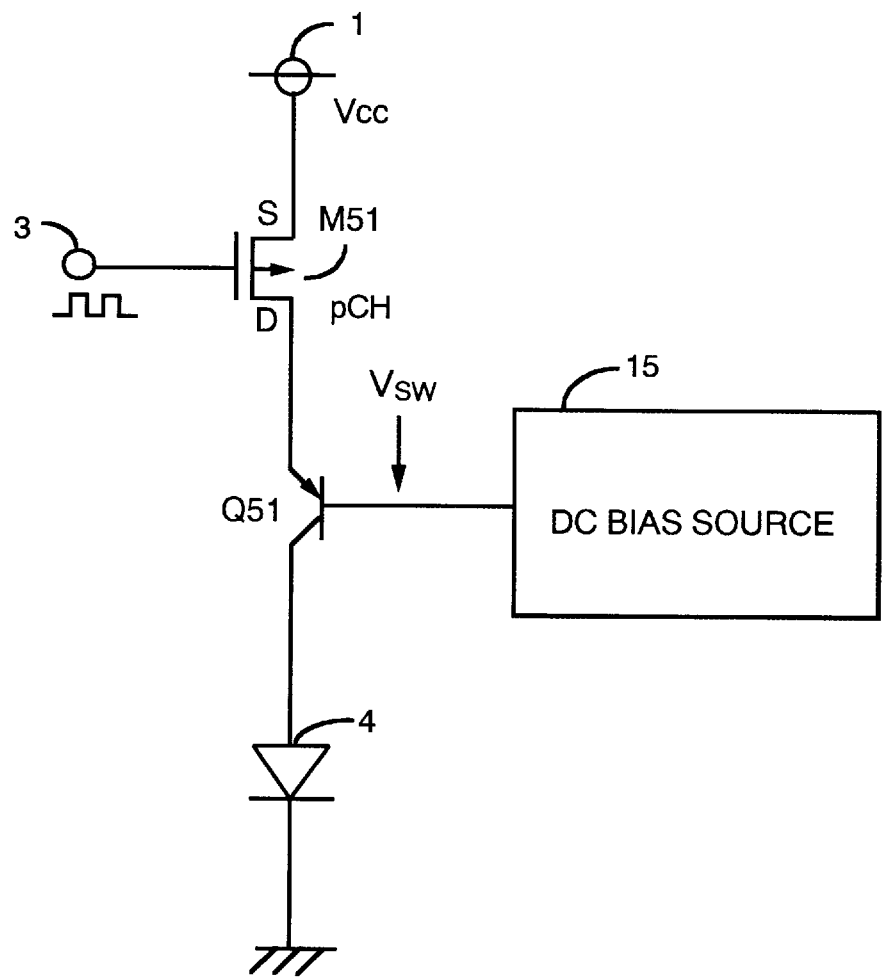
FIG. 9 shows a current switching circuit according to a sixth embodiment of the present invention.

FIG. 9 shows a current switching circuit in the sixth embodiment of the present invention. From the first embodiment though the fifth embodiment, the current switching circuit comprises npn transistors as driving transistors, and p channel MOS transistors as switching transistors. In contrast, from the sixth embodiment to the ninth embodiment, the current switching circuit comprises pnp transistors as driving transistors, and the p channel MOS transistors as switching transistors. Thus, although the connections of respective elements are different, the principles of the respective operation are the same as those of the first embodiment through the fifth embodiment. In addition, the sixth embodiment through the ninth embodiment corresponds to the first embodiment through the fifth embodiment, respectively.

In FIG. 9, the current switching circuit comprises a power source 1, a bipolar transistor Q51, a p channel switching MOS transistor M51, a data input terminal 3 supplied with a data signal which controls the gate of the switching MOS transistor M51, a laser diode 4 which is driven by the current flowing through in the bipolar transistor Q51 and used in a device such as in a printer, and a DC bias source 15 which controls the base current of the bipolar transistor Q51.

In FIG. 9, an MOS transistor M51 used as a switching circuit and a bipolar transistor Q51 are on the same IC. In the prior art of this kind of high frequency switching circuit, a current switching circuit having pnp bipolar transistors and MOS transistors which are formed on the same IC substrate has not yet been disclosed By using such MOS transistor as a switching element, it is possible to remove the problematic voltage between the base and the emitter in the conventional bipolar transistor current switching circuit, which makes it possible to widen the dynamic range of the bipolar transistor Q51. In order to increase the switching speed, the bipolar transistor Q51 operates in a base grounded mode. A constant voltage DC bias source 15 supplies the driving current to the base electrode of the bipolar transistor Q51. The current flowing into the bipolar transistor Q51 is controlled by turning on and off the switching MOS transistor. When the laser diode 4 is not supplied with a current, a current flowing into the bipolar transistor Q51 can be completely cut off. Therefore, it is possible to reduce unwanted power consumption.

Figure 10:
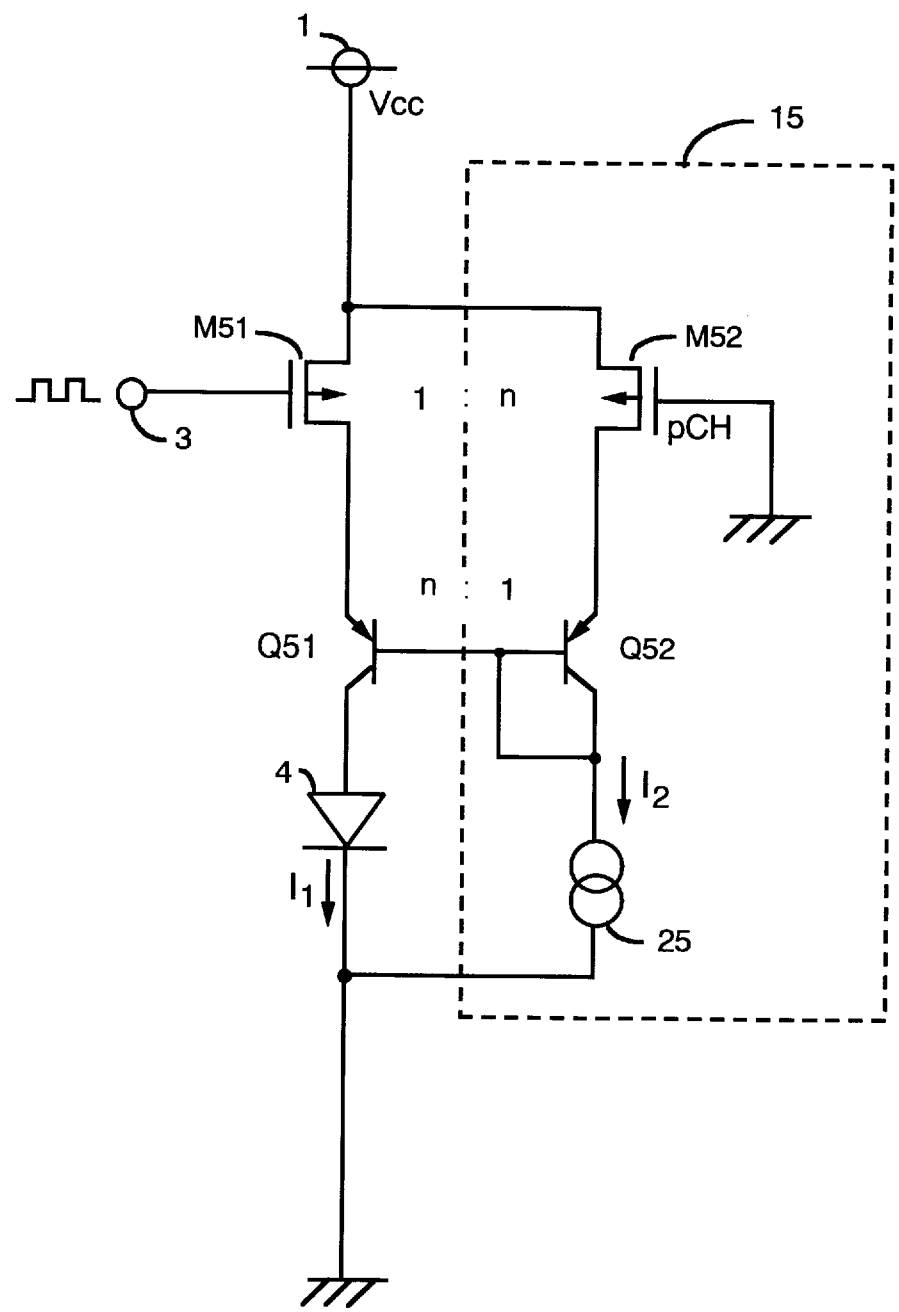
FIG. 10 shows a detailed circuit of the current switching circuit of FIG. 9.

FIG. 10 shows a detailed circuit of the current switching circuit of FIG. 9. In FIG. 10, a DC bias source 15 controls the base current of the bipolar transistor Q51. In FIG. 10, the current switching circuit comprises a power supply 1, a bipolar transistor Q51, an n channel switching MOS transistor M51, a data input terminal 3 which receives a data signal which controls the gate of the switching MOS transistor M51, a laser diode 4 which is driven by the current flowing through the bipolar transistor Q51 and used in a device such as a printer, and a DC bias source 15 which controls the base current of the bipolar transistor Q51. The current switching circuit further comprises a bipolar transistor Q52 which forms a current mirror circuit together with the bipolar transistor Q51. By setting the current ratio between the transistors Q51 and Q52 to n:1, the current flowing through the bipolar transistor Q52 is adjusted to 1/n of the bipolar transistor Q51. Therefore, the bipolar transistor Q52 can be a transistor in which a small amount of current can flow. The constant current supply 25 supplies the constant current to the bipolar transistor Q52. The source of the MOS transistor M52 receives the power source voltage from the power supply 1, and the drain electrode of the MOS transistor M52 is connected to the emitter electrode of the bipolar transistor Q52, and the gate electrode of the MOS transistor M52 is grounded. The collector electrode of the bipolar transistor Q52 is connected to one end of the constant current supply 25, and the base electrode of the bipolar transistor Q52 is connected to the base electrode of the bipolar transistor Q51 and the collector electrode of the bipolar transistor Q52. The other end of the constant current supply 25 is grounded.

Since the operation of FIG. 10 is almost the same as that of FIG. 2, the description thereof is omitted. In the current switching circuit of the sixth embodiment, when the data signal changes to "L", the large current which drives the laser diode 4 is cut off completely. The current of the bipolar transistor Q52 keeps flowing, but the current is small. Therefore, the power consumption of the current switching circuit as a whole can be small. Further, since the MOS transistor M51 does not have a large voltage between the base and emitter unlike the conventional bipolar transistor, the dynamic range of the bipolar transistor Q51 can be widened.

Embodiment 7

Figure 11:
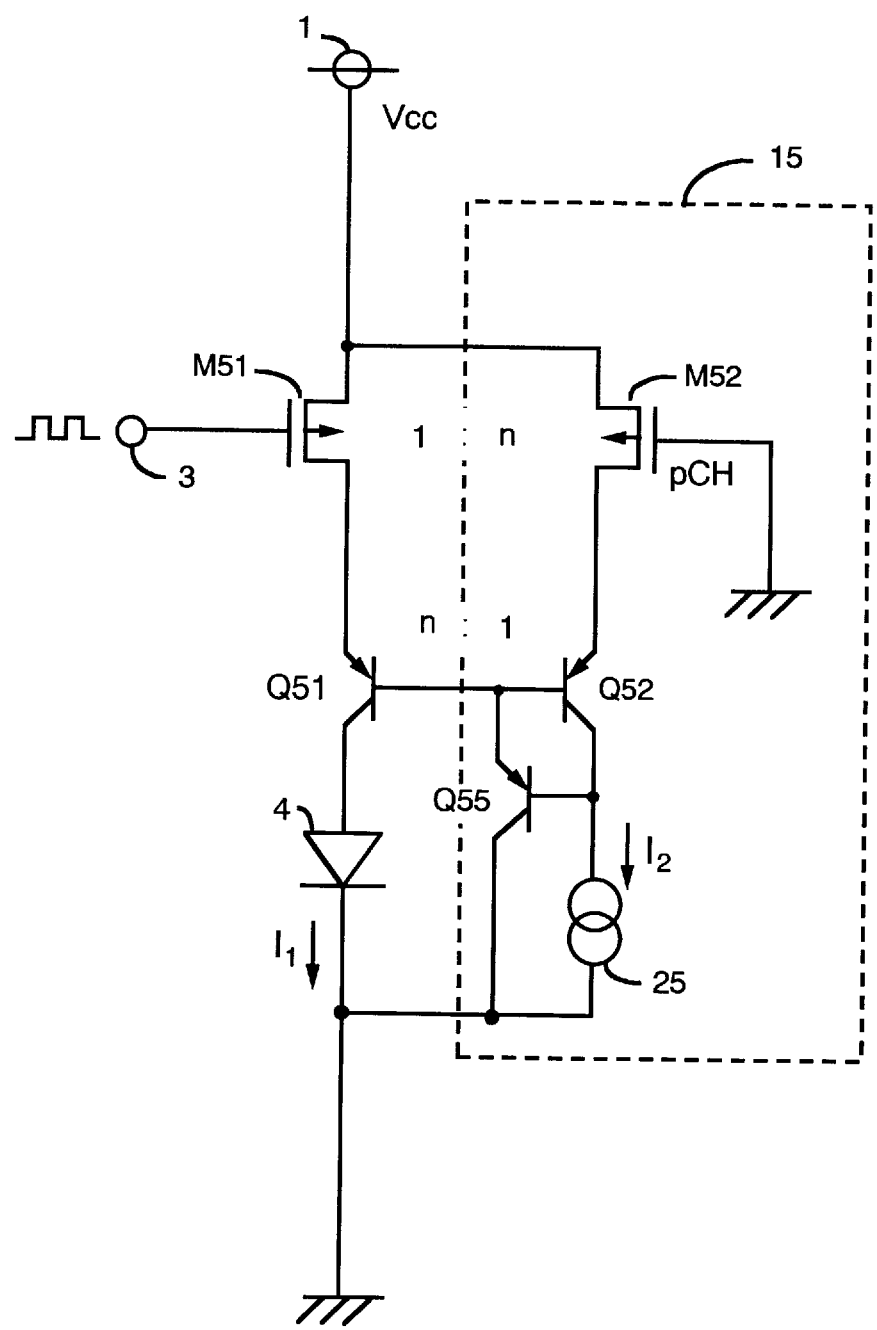
FIG. 11 shows a current switching circuit according to a seventh embodiment of the present invention.

FIG. 11 shows current switching circuit according to the seventh embodiment of the present invention. In FIG. 11, the DC bias source 15 controls the base current of the bipolar transistor Q51. In FIG. 11, the main circuit including the load laser diode 4 and the bipolar transistor Q51 is the same as tat of FIG. 9, the explanation thereof is therefore omitted. In FIG. 11, the pnp type bipolar transistor Q52 and the pnp type bipolar transistor Q51 constitute a current mirror circuit. By setting the current ratio between the transistors Q51 and Q52 to n:1, the current flowing through the bipolar transistor Q52 is adjusted to 1/n of that of the bipolar transistor Q51. Therefore, the bipolar transistor Q52 can be a small transistor in which a small amount of current flows. The constant current supply 25 supplies the constant current to the bipolar transistor Q52. A pnp type bipolar transistor Q55 supplies a base current to bases of the bipolar transistor Q51 and the bipolar transistor Q52. The source of the MOS transistor M52 is applied with the power source voltage from the power supply 1, and the drain electrode of the MOS transistor M52 is connected to the emitter electrode of the bipolar transistor Q52, and the gate electrode of the MOS transistor M52 is grounded. The collector electrode of the bipolar transistor Q52 is connected to one end of the constant current supply 25, and the base electrode of the bipolar transistor Q52 is connected to the base electrode of the bipolar transistor Q51 and the collector electrode of the bipolar transistor Q52. The other end of the constant current supply 25 is grounded Since the operation of FIG. 11 is almost the same as that of FIG. 3. The description thereof is omitted. In the current switching circuit of the seventh embodiment, when the data signal changes to "L", the large current which drives the laser diode 4 is cut off completely. On the other hand, the current of the bipolar transistor Q52 keeps flowing, but since the current is small, the power consumption of the current switching circuit as a whole can be small. Further, since the MOS transistor M51 does not have a large voltage between the base and the emitter, unlike the conventional bipolar transistor, the dynamic range of the bipolar transistor Q51 can be widened.

In addition to the invention of the sixth embodiment, a third pnp bipolar transistor is provided. In the third bipolar transistor, the collector electrode is connected to a ground, and the emitter electrode is connected to a base electrode of the bipolar transistor. Therefore, in the sixth embodiment, the distortion of the waveform can be prevented when the driving current flowing through the laser diode 4 is rising.

Embodiment 8

Figure 12:
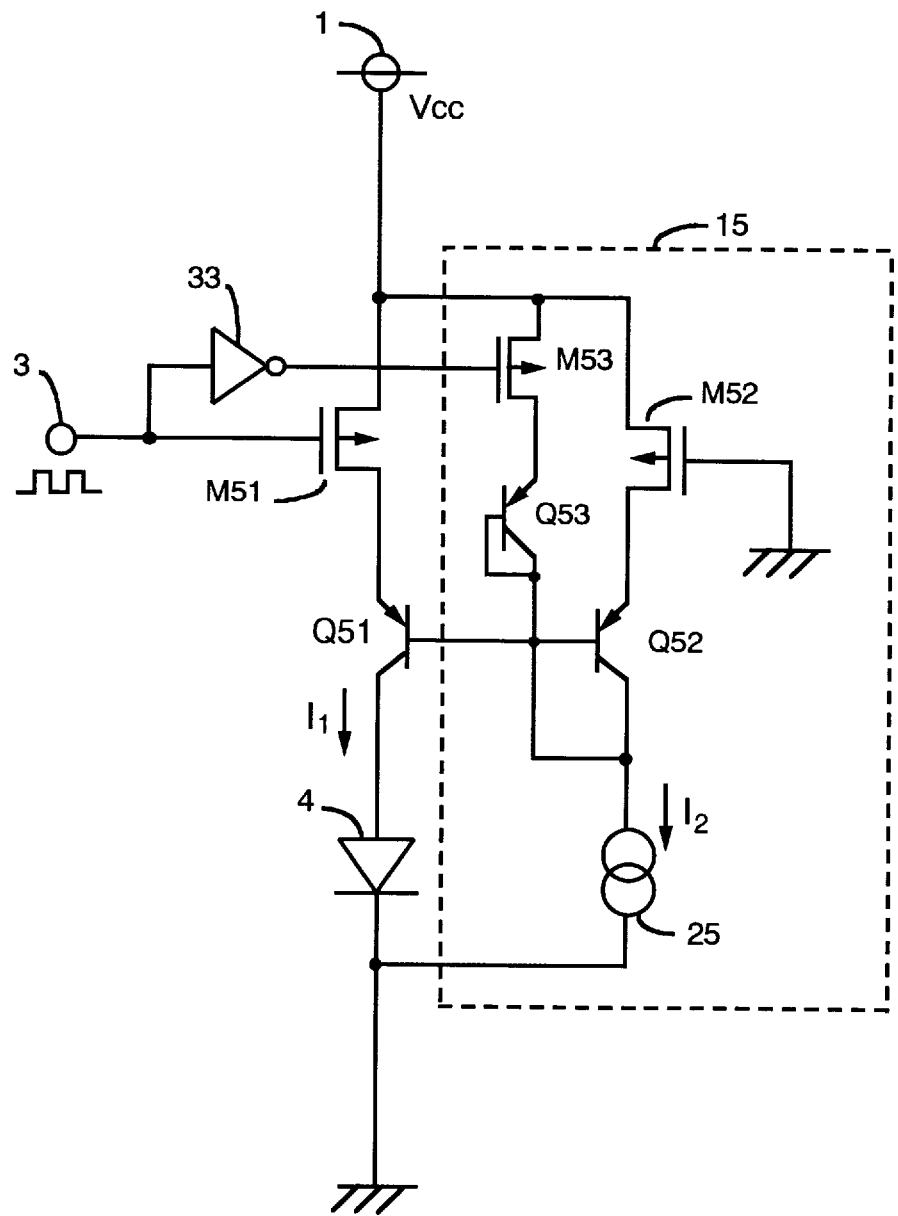
FIG. 12 shows a current switching circuit according to an eighth embodiment of the present invention.

FIG. 12 shows the current switching circuit in an eighth embodiment of the present invention. In FIG. 12, the DC bias source 15 controls the base current of the bipolar transistor Q51. In FIG. 12, the main circuit including the load laser diode 4 and the bipolar transistor Q51 is the same as FIG. 9, therefore the explanation thereof is omitted. In FIG. 12, the p type bipolar transistor Q52 and the bipolar transistor Q51 constitute a current mirror circuit. By setting the current ratio between the bipolar transistor Q51 and the bipolar transistor Q52 to n:1, the current flowing through the bipolar transistor Q52 is adjusted to 1/n of the bipolar transistor Q51. Therefore, the bipolar transistor Q52 can be a small transistor in which a small amount of current flows. The constant current supply 25 supplies the constant current to the bipolar transistor Q52. The source of the MOS transistor M52 is applied with the power source voltage from the power supply 1, and the drain electrode of the MOS transistor M52 is connected to the emitter electrode of the bipolar transistor Q52, and the gate electrode of the MOS transistor M52 is grounded. The collector electrode of the bipolar transistor Q52 is connected to one end of the constant current supply 25, and the base electrode of the bipolar transistor Q52 is connected to the base electrode of the bipolar transistor Q51 and the collector electrode of the bipolar transistor Q52. The other end of the constant current supply 25 is grounded.

An MOS transistor M53 and a bipolar transistor Q53 are connected in series.

The MOS transistor M53 is wired so that it turns on when the MOS transistor M51 turns off. The source electrode of the MOS transistor M53 is connected to the power supply 1, and the drain electrode of the MOS transistor M53 is connected to the emitter electrode of the bipolar transistor Q53. The signal from the input terminal 3 is inverted by the inverter 33, and the inverted signal is applied to a gate electrode of the MOS transistor M53. The collector electrode of the bipolar transistor Q53 is connected to the commonly connected base electrodes of the bipolar transistor Q51 and Q52, and the base electrode and the collector electrode of the bipolar transistor Q53 are connected to each other.

Since the operation of FIG. 12 is almost the same as that of FIG. 4. the description thereof is herein omitted. In the current switching circuit of the eighth embodiment, when the data signal changes to "L", the large current which drives the laser diode 4 is cut off completely. On the other hand, the current of the bipolar transistor Q52 keeps flowing, but since the current is small, the power consumption of the current switching circuit as a whole can be small. Further, since the MOS transistor M51 does not have a large voltage between the base and the emitter, unlike the conventional bipolar transistor, the dynamic range of the bipolar transistor Q51 can be widened.

In addition to the invention of the sixth embodiment, a pnp bipolar transistor Q53 and a p channel MOS transistor are provided. The collector electrode of the bipolar transistor Q53 is connected to the base electrode of the pnp type bipolar transistor Q52, and the base electrode and the collector electrode of the bipolar transistor Q53 are connected to each other. The drain electrode of the MOS transistor M53 is connected to the emitter electrode of the bipolar transistor Q53, the source electrode of the MOS transistor M53 is connected to the power supply 1, and the gate electrode is connected to the input terminal via an inverter 33. Therefore, the distortion of the waveform can be prevented when the driving current flowing through the laser diode 4 is rising.

Embodiment 9

Figure 13:
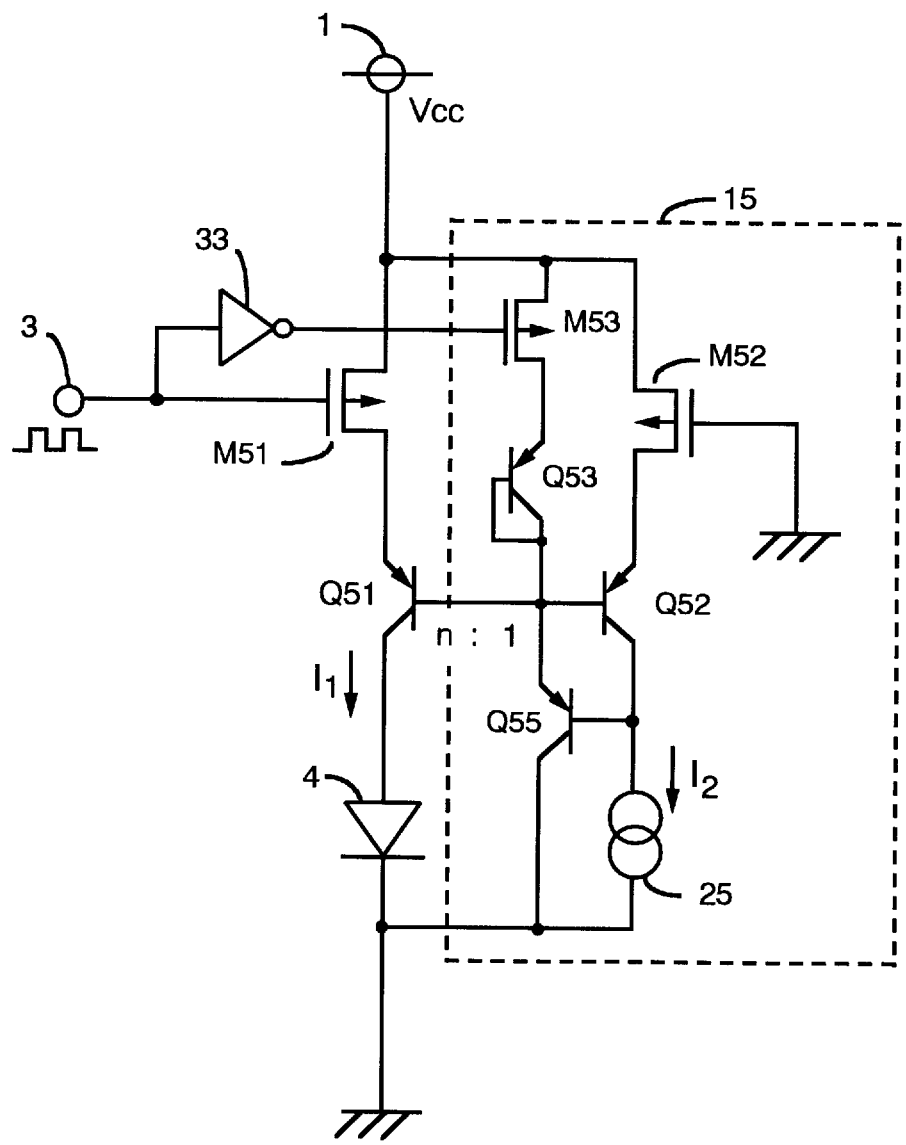
FIG. 13 shows a current switching circuit according to a ninth embodiment of the present invention.

FIG. 13 shows a current switching circuit according to a ninth embodiment of the present invention. In FIG. 13, the DC bias source 15 controls the base current of the bipolar transistor Q51. FIG. 13 illustrates another detailed circuit of the DC bias source 15 of FIG. 9. In FIG. 13, the main circuit including the load laser diode 4 and the bipolar transistor Q51 is the same as that of FIG. 9, so the explanation is therefore omitted. In FIG. 13, the source electrode of the MOS transistor M52 receives the power supply voltage from the power supply 1, and the drain electrode of the MOS transistor M52 is connected to the emitter electrode of the bipolar transistor Q52, and the gate electrode of the MOS transistor M52 is grounded. The collector electrode of the bipolar transistor Q52 is connected to one end of the constant current supply 25, and the base electrode of the bipolar transistor Q52 is connected to the base electrode of the bipolar transistor Q51. The other end of the constant current supply 25 is grounded. The pnp type bipolar transistor Q52 and the pnp type bipolar transistor Q52 constitute a current mirror circuit. By setting the current ratio between the transistors Q51 and Q52 to n:1, the current flowing through the bipolar transistor Q52 is adjusted to 1/n of that of the bipolar transistor Q51. Therefore, the bipolar transistor Q22 may be a small transistor in which a small amount of current flows.

The bipolar transistor Q55 recombines the accumulated holes in the bases of bipolar transistor Q51 and the bipolar transistor Q52. The emitter electrode of the bipolar transistor Q55 is connected to the commonly connected base electrodes of the bipolar transistor Q51 and the bipolar transistor Q52, and the collector electrodes of the bipolar transistor Q55 is grounded and the base electrode of the bipolar transistor Q55 is connected to the current source 25.

A p channel MOS transistor M53 and p type bipolar transistor Q53 are connected in series, and this series circuit is wired so that the MOS transistor M53 turns on when the MOS transistor M51 turns off. The source electrode of the MOS transistor M53 is connected to the power source 1, and the drain electrode of the MOS transistor M53 is connected to the emitter electrode of bipolar transistor Q53. The gate electrode of the MOS transistor M53 receives an input signal which is inverted by the inverter 33. The collector of the transistor Q53 is connected to the commonly connected base of the transistor Q51 and the bipolar transistor Q52, and the base electrode and the collector electrode of the transistor Q53 are connected to each other.

The operation of FIG. 13 is almost the same as that of FIG. 5, therefore the explanation is omitted. In the current switching circuit according to the ninth embodiment, when the data signal changes to the logic "L", the large current which drives the laser diode 4 is completely cut off. In contrast, the current flowing through the bipolar transistor Q52 keeps flowing, but since the current is reduced, the power consumption of the current switching circuit as a whole can be small. Further, since the MOS transistor M51 does not have a large voltage between the base and the emitter, unlike the conventional bipolar transistor, the dynamic range of the bipolar transistor Q51 can be widened.

In addition, since a fourth bipolar transistor is provided, the waveform of the driving current flowing through the laser diode can be prevented distortion caused by the rising of the driving current. The series circuit of the bipolar transistor Q53 and the MOS transistor M53 recombines the holes accumulated on the base electrode.

Therefore, the distortion of the current waveform when the driving current $I_1$ is falling is reduced.

Embodiment 10

Figure 14:
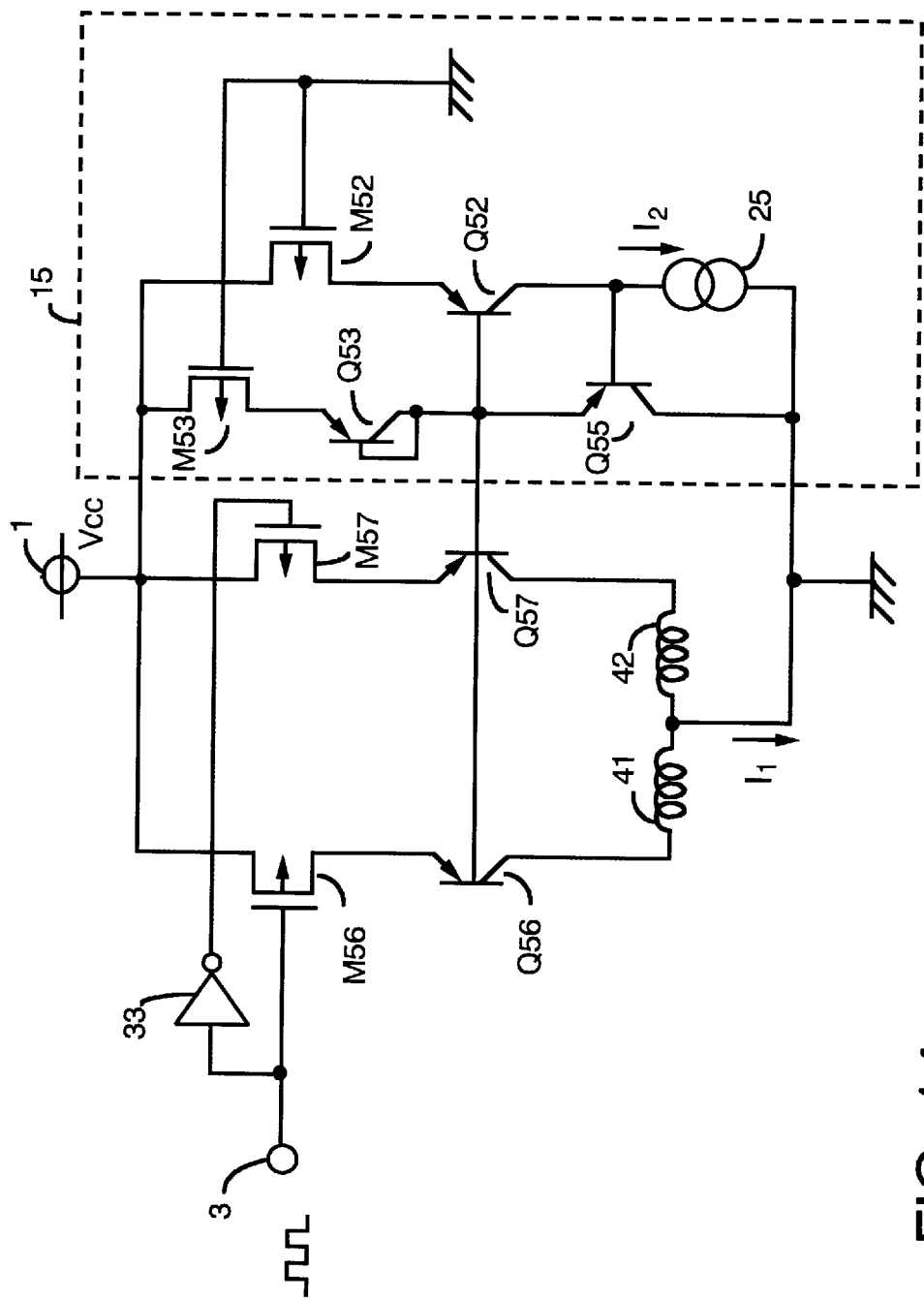
FIG. 14 shows a current switching circuit according to a tenth embodiment of the invention.

FIG. 14 shows the current switching circuit in a tenth embodiment of the present invention. FIG. 14 shows an example in which the current switching circuit drives an inductance load such as a magnetic head coil. In FIG. 14, the current switching circuit comprises a DC bias source 15 which controls the base current of transistors Q56 and Q57. FIG. 14 illustrates a detailed circuit diagram of the DC bias source 15 of FIG. 9, which is the same as that of FIG. 13. Therefore, the explanation is omitted. Of course, the elements of the DC bias source in FIG. 14 can be substituted for any one of the circuits shown from FIG. 10 to FIG. 12.

In FIG. 14, pnp type bipolar transistors Q56 and Q57 constitute a current mirror circuit with bipolar transistor Q52. By setting the current ratio between the bipolar transistor Q56, the bipolar transistor Q57 and the bipolar transistor Q22 to n:n:1, the current flowing through the bipolar transistor Q52 is adjusted to 1/n of the currents of the bipolar transistors Q56 and Q57. Therefore, the bipolar transistor Q52 may be a small transistor in which a small amount of current flows. The inductance loads 41 and 42 are exemplified by a coil of a magnetic head. The source electrode of the MOS transistor M56 is connected to the power supply 1. The drain of the MOS transistor M56 is connected to the emitter electrode of the bipolar transistor Q56. The gate of the MOS transistor M56 is connected to the data input terminal 3. The collector of the MOS transistor M56 is grounded via the inductor 41. In contrast, the source electrode of the MOS transistor M57 is connected to the power supply 1. The drain of the MOS transistor M57 is connected to the emitter electrode of the bipolar transistor Q57 and the gate of the MOS transistor M57 is connected to the data input terminal 3 via the inverter 33. The collector of the bipolar transistor Q57 is grounded via the inductor 42.

The operation of FIG. 14 is almost the same as that of FIG. 6, therefore the explanation thereof is herein omitted. In the current switching circuit according to the tenth embodiment, when either of the MOS transistors M56 or M57 turns off, the large current which drives the inductor 41 and the inductor 42, respectively, is completely cut off. In contrast the current flowing through the bipolar transistor Q52 keeps flowing, but since the current is small, the power consumption of the current switching circuit as a whole can be small.

Further, since each MOS transistor M56 and M57 does not have a large voltage between the base and emitter, unlike the conventional bipolar transistor, the dynamic range of the transistors Q56 and Q57 can be widened.

In addition, since a fourth bipolar transistor is provided, the waveform of the driving current flowing through the laser diode 4 can be prevented from the distortion caused by the rising of the driving current. The series circuit of the bipolar transistor Q53 and the MOS transistor M53 recombines the holes accumulated in the base electrode. Therefore, the distortion of the current waveform when the driving current $I_1$ is falling is reduced. Therefore, the waveform of the driving current flowing through the laser diode can be controlled so as not to be distorted at the time of activation.

What is claimed is:

1. A current switching circuit comprising:
    a load having a first terminal connected to a positive power supply and a second terminal;
    a first npn bipolar transistor having a collector connected to the second terminal of the load, a base electrode, and an emitter electrode;
    a DC bias source comprising:
        a constant current supply having a first terminal connected to the positive power supply and a second terminal;
        a second npn bipolar transistor having a collector electrode connected to the second terminal of the constant current supply, a base electrode connected to the base electrode of the first npn bipolar transistor to form a current mirror circuit, and an emitter electrode; and
        a second n channel MOS transistor having a drain electrode connected to the emitter electrode of the second npn bipolar transistor, a source electrode connected to the ground, and a gate electrode connected to the positive power supply; and
    a first n channel MOS transistor having a drain electrode connected to the emitter electrode of the first npn bipolar transistor, a source electrode connected to a ground, and a gate electrode connected to an input terminal of the current switching circuit, wherein the first n channel MOS transistor turns on and off in response to a voltage applied to the input terminal of current switching circuit.

2. The current switching circuit according to claim 1 wherein the DC bias source comprises:
    a third npn bipolar transistor having a collector electrode connected to the positive power supply, an emitter electrode connected to the base electrode of the first npn bipolar transistor, and a gate electrode connected to the second terminal of the constant current supply.

3. The current switching circuit according to claim 1 wherein the DC bias source comprises:
    a third npn bipolar transistor having a collector electrode and a base electrode that are both connected to the base electrodes of the first and second npn bipolar transistors, and an emitter electrode;
    a third n channel MOS transistor having a drain electrode connected to the emitter electrode of the third npn bipolar transistor, a source electrode connected to the ground, and a gate electrode; and
    an inverter having input and output nodes, the input node being connected to the input terminal of the current switching circuit and the output node being connected to the gate electrode of the third n channel MOS transistor.

4. The current switching circuit according to claim 3 wherein the DC bias source comprises:
   a fourth bipolar transistor having a collector electrode connected to the positive power supply, an emitter electrode connected to the base electrodes of the first and second npn bipolar transistors, and a base electrode connected to the second terminal of the constant current supply.

5. A current switching circuit comprising:
   first and second inductances having a common connection connected to a positive power supply;
   a first npn bipolar transistor having a collector electrode connected to the first inductance, a base electrode connected to an output of a DC bias source, and an emitter electrode;
   a first n channel MOS transistor having a drain electrode connected to the emitter electrode of the first npn bipolar transistor, a source electrode connected to a ground, and a gate electrode connected to an input terminal of the current switching circuit;
   a second npn bipolar transistor having a collector electrode connected to the second inductance, a base electrode connected to the output of the DC bias source, and an emitter electrode;
   a second n channel MOS transistor having a drain electrode connected to the emitter electrode of the second npn bipolar transistor, a source electrode connected to the ground, and a gate electrode;
   an inverter having an input node connected to the input terminal of the current switching circuit and an output node connected to the gate electrode of the second n channel MOS transistor, wherein the DC bias source comprises:
      a constant current supply having a first terminal connected to the positive power supply and a second terminal;
      a third npn bipolar transistor having a collector electrode connected to the second terminal of the constant current supply, a base electrode connected to the base electrodes of the first and second npn bipolar transistors to form a current mirror circuit, and an emitter electrode;
      a fourth npn bipolar transistor having a collector electrode connected to the positive power supply, an emitter electrode connected to the base electrodes of the first, second, and third npn bipolar transistors, and a base electrode connected to the second terminal of the constant current supply;
      a third n channel MOS transistor having a drain electrode connected to the emitter electrode of the third npn bipolar transistor, a source electrode connected to the ground, and a gate electrode connected to the positive power supply;
      a fifth npn bipolar transistor having a collector electrode and a base electrode both connected to the base electrodes of the first, second, and third npn bipolar transistors, and an emitter electrode; and
      a fourth n channel MOS transistor having a drain electrode connected to the emitter electrode of the fifth npn bipolar transistor, a source electrode connected to the ground, and a gate electrode connected to the positive power supply, wherein the first n channel MOS transistor and the second n channel MOS transistor inversely turn on and off in response to a voltage applied to the input terminal of the current switching circuit.

6. A current switching circuit comprising:
   a load having a first terminal connected to a ground and a second terminal;
   a first pnp bipolar transistor having a collector connected to the second terminal of the load, a base electrode, and an emitter electrode;
   a DC bias source comprising:
      a constant current supply having a first terminal connected to the ground and a second terminal;
      a second pnp bipolar transistor having a collector electrode connected to the second terminal of the constant current supply, a base electrode connected to the base electrode of the first pnp bipolar transistor to form a current mirror circuit, and an emitter electrode; and
      a second p channel MOS transistor having a drain electrode connected to the emitter electrode of the second pnp bipolar transistor, a source electrode connected to the positive power supply, and a gate electrode connected to the ground; and
   a first p channel MOS transistor having a drain electrode connected to the emitter electrode of the first pnp bipolar transistor, a source electrode connected to a positive power supply, and a gate electrode connected to an input terminal of the current switching circuit, wherein the first p channel MOS transistor turns on and off in response to a voltage applied to the input terminal of the current switching circuit.

7. The current switching circuit according to claim 6 wherein the DC bias source comprises:
   a third pnp bipolar transistor having a collector electrode connected to the ground, an emitter electrode connected to the base electrode of the first pnp bipolar transistor, and a base electrode connected to the second terminal of the constant current supply.

8. The current switching circuit according to claim 6 wherein the DC bias source comprises:
   a third pnp bipolar transistor having a collector electrode and a base electrode that are both connected to the base electrodes of the first and second pnp bipolar transistors, and an emitter electrode;
   a third p channel MOS transistor having a drain electrode connected to the emitter electrode of the third pnp bipolar transistor, a source electrode connected to the positive power supply, and a gate electrode; and
   an inverter having input and output nodes, the input node being connected to the input terminal of the current switching circuit and the output node being connected to the gate electrode of the third p channel MOS transistor.

9. The current switching circuit according to claim 8 wherein the DC bias source comprises:
   a fourth bipolar transistor having a collector electrode connected to the positive power supply, an emitter electrode connected to the base electrodes of the first and second pnp bipolar transistors, and a base electrode connected to the second terminal of the constant current supply.

10. A current switching circuit comprising:
    first and second inductances having a common connection connected to a ground;
    a first pnp bipolar transistor having a collector electrode connected to the first inductance, a base electrode connected to an output of a DC bias source, and an emitter electrode;

a first p channel MOS transistor having a drain electrode connected to the emitter electrode of the first pnp bipolar transistor, a source electrode connected to a positive power supply, and a gate electrode connected to an input terminal of the current switching circuit;

a second pnp bipolar transistor having a collector electrode connected to the second inductance, a base electrode connected to the output of the DC bias source, and an emitter electrode;

a second p channel MOS transistor having a drain electrode connected to the emitter electrode of the second pnp bipolar transistor, a source electrode connected to the positive power supply, and a gate electrode;

an inverter having an input node connected to the input terminal of the current switching circuit and an output node connected to the gate electrode of the second p channel MOS transistor, wherein the DC bias source comprises:

a constant current supply having a first terminal connected to the ground and the second terminal;

a third pnp bipolar transistor having a collector electrode connected to the second terminal of the constant current supply, a base electrode connected to the base electrodes of the first and second pnp bipolar transistors to form a current mirror circuit, and an emitter electrode;

a fourth pnp bipolar transistor having a collector electrode connected to the ground, an emitter electrode connected to the base of the first, second, and third pnp bipolar transistors, and a base electrode connected to the second terminal of the constant current supply;

a third p channel MOS transistor having a drain electrode connected to the emitter electrode of the third pnp bipolar transistor, a source electrode connected to the positive power supply, and a gate electrode connected to a ground;

a fifth pnp bipolar transistor having a collector electrode and a base electrode both connected to the base electrodes of the first, second, and third pnp bipolar transistors, and an emitter electrode; and a fourth p channel MOS transistor having a drain electrode connected to the emitter electrode of the fifth pnp bipolar transistor, a source electrode connected to the positive power supply, and a gate electrode connected to the ground, wherein the first p channel MOS transistor and the second p channel MOS transistor inversely turn on and off in response to a voltage applied to the input terminal of the current switching circuit.

* * * * *